United States Patent
Zhang et al.

(10) Patent No.: US 12,075,686 B2
(45) Date of Patent: Aug. 27, 2024

(54) DISPLAY SUBSTRATE WITH VIRTUAL SUBPIXELS, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Zhang, Beijing (CN); Xiangdan Dong, Beijing (CN); Junxi Wang, Beijing (CN); Yixiang Yang, Beijing (CN); Yulong Wei, Beijing (CN); Jie Gou, Beijing (CN); Rong Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 703 days.

(21) Appl. No.: 17/280,122

(22) PCT Filed: Jun. 24, 2020

(86) PCT No.: PCT/CN2020/097902
§ 371 (c)(1),
(2) Date: Mar. 25, 2021

(87) PCT Pub. No.: WO2021/258318
PCT Pub. Date: Dec. 30, 2021

(65) Prior Publication Data
US 2022/0045141 A1 Feb. 10, 2022

(51) Int. Cl.
*H10K 59/88* (2023.01)
*H10K 59/121* (2023.01)
(Continued)

(52) U.S. Cl.
CPC ......... *H10K 59/88* (2023.02); *H10K 59/1213* (2023.02); *H10K 59/1216* (2023.02);
(Continued)

(58) Field of Classification Search
CPC ...... H10K 59/88; H10K 59/131; H10K 71/00; H10K 59/1213; H10K 59/1216; H10K 59/1201
See application file for complete search history.

(56) References Cited

U.S. PATENT DOCUMENTS 8,159,420 B2 * 4/2012 Takahashi ............ G09G 3/3233
345/83
10,115,337 B2 * 10/2018 Kim .................... G09G 3/3225
(Continued)

FOREIGN PATENT DOCUMENTS

EP    3276668 A1    1/2018
EP    3660827 A1    6/2020

OTHER PUBLICATIONS

Extended European Search Report of EP Application No. 20942139 dated Mar. 20, 2023, 9 pages.

*Primary Examiner* — Afroza Chowdhury
(74) *Attorney, Agent, or Firm* — MUNCY, GEISSLER, OLDS & LOWE, P.C.

(57) ABSTRACT

The present disclosure provides a display substrate, a manufacturing method thereof, and a display device. The display substrate includes a base substrate and a plurality of subpixels arranged on the base substrate in an array form. The plurality of subpixels includes a plurality of display subpixels at a display region of the display substrate and a plurality of virtual subpixels, and at least a part of the virtual subpixels are arranged adjacent to the display subpixels. The virtual subpixel includes a first potential signal line pattern, a virtual subpixel driving circuit including a virtual driving transistor and a first conductive connection member coupled
(Continued)

to a gate electrode of the virtual driving transistor, and a second conductive connection member coupled to the first conductive connection member and the first potential signal line pattern.

20 Claims, 20 Drawing Sheets

(51) Int. Cl.
*H10K 59/131* (2023.01)
*H10K 71/00* (2023.01)
*H10K 59/12* (2023.01)

(52) U.S. Cl.
CPC ........... *H10K 59/131* (2023.02); *H10K 71/00* (2023.02); *H10K 59/1201* (2023.02)

(56) References Cited

U.S. PATENT DOCUMENTS

| | | | |
|---|---|---|---|
| 2003/0155612 A1 | 8/2003 | Kawachi et al. | |
| 2008/0309653 A1* | 12/2008 | Takahashi | G09G 3/3233 |
| | | | 345/211 |
| 2016/0321992 A1* | 11/2016 | Kim | G09G 3/3225 |
| 2017/0236474 A1* | 8/2017 | Xu | G02F 1/1368 |
| | | | 345/209 |
| 2018/0145093 A1* | 5/2018 | Xi | H01L 27/1214 |
| 2018/0342572 A1 | 11/2018 | Park et al. | |
| 2019/0064552 A1 | 2/2019 | Kim et al. | |

* cited by examiner

DISPLAY SUBSTRATE WITH VIRTUAL SUBPIXELS, MANUFACTURING METHOD THEREOF, AND DISPLAY DEVICE

CROSS-REFERENCE TO RELATED APPLICATION

The present application is the U.S. national phase of PCT Application No. PCT/CN2020/097902 filed on Jun. 24, 2020, which is incorporated herein by reference in its entirety.

TECHNICAL FIELD

The present disclosure relates to the field of display technology, in particular to a display substrate, a manufacturing method thereof, and a display device.

BACKGROUND

Along with the continuous development of the display technology, flexible Organic Light-Emitting Diode (OLED) display panel has been applied more widely. In order to increase its market share in future, more and more attention has been paid by manufacturers to the yield and display quality of the display panel.

In the flexible OLED display panel, each subpixel corresponds to its own subpixel driving circuit, and usually the subpixel driving circuit includes a driving transistor which is capable of being turned on under the control of its gate electrode, so as to provide a driving signal to the corresponding subpixel. Hence, a potential at the gate electrode of the driving transistor plays a very important role in the operation of the entire subpixel driving circuit, and it is an important factor for the yield and display quality of the display panel.

SUMMARY

An object of the present disclosure is to provide a display substrate, a manufacturing method thereof, and a display device.

In one aspect, the present disclosure provides in some embodiments a display substrate, including a base substrate and a plurality of subpixels arranged on the base substrate in an array form. The plurality of subpixels includes a plurality of display subpixels at a display region of the display substrate and a plurality of virtual subpixels, and at least a part of the virtual subpixels are arranged adjacent to the display subpixels. The display subpixel includes a display subpixel driving circuit, and the display subpixel driving circuit includes a driving transistor, a first transistor and a second transistor. A gate electrode of the driving transistor is coupled to a second electrode of the first transistor and a second electrode of the second transistor. The virtual subpixel includes a first potential signal line pattern, a virtual subpixel driving circuit including a virtual driving transistor and a first conductive connection member coupled to a gate electrode of the virtual driving transistor, and a second conductive connection member coupled to the first conductive connection member and the first potential signal line pattern.

In a possible embodiment of the present disclosure, the first conductive connection member extends in a first direction, the first potential signal line pattern includes a first power source signal line pattern including a first portion extending in the first direction, the second conductive connection member extends in a second direction intersecting the first direction, and the second conductive connection member is coupled to the first conductive connection member and the first portion of the first power source signal line pattern.

In a possible embodiment of the present disclosure, the first potential signal line pattern includes a first power source signal line pattern including a first portion and a second portion coupled to each other, the first portion extends in a first direction, the second portion extends in a second direction intersecting the first direction, the first conductive connection member extends in the first direction, and the second conductive connection member extends in the first direction and is coupled to the first conductive connection member and the second portion of the first power source signal line pattern.

In a possible embodiment of the present disclosure, the second portions in at least two virtual subpixels are coupled to each other in the second direction.

In a possible embodiment of the present disclosure, the first portion and the second portion in at least one target virtual subpixel are formed integrally, and the target virtual subpixel is an outermost virtual subpixel arranged at the display region in the first direction.

In a possible embodiment of the present disclosure, the first potential signal line pattern includes a first power source signal line pattern, and the first conductive connection member, the second conductive connection member and the first power source signal line pattern are formed integrally.

In a possible embodiment of the present disclosure, the virtual subpixel further includes a first gate line pattern and a first light-emission control signal line pattern each extending in the second direction. The first gate line pattern and the first light-emission control signal line pattern are arranged in the first direction, an orthogonal projection of the gate electrode of the virtual driving transistor onto the base substrate is located between an orthogonal projection of the first gate line pattern onto the base substrate and an orthogonal projection of the first light-emission control signal line pattern onto the base substrate, and the orthogonal projection of the first gate line pattern onto the base substrate is located between an orthogonal projection of the second conductive connection member onto the base substrate and the orthogonal projection of the first light-emission control signal line pattern onto the base substrate.

In a possible embodiment of the present disclosure, the display subpixel includes a second gate line pattern and a second light-emission control signal line pattern each extending in the second direction. The first gate line pattern in at least one virtual subpixel in the second direction is formed integrally with the second gate line pattern in a display subpixel arranged adjacent to the at least one virtual subpixel and arranged in a same row as the virtual subpixel in the second direction. The first light-emission control signal line pattern in at least one virtual subpixel in the second direction is formed integrally with the second light-emission control signal line pattern in a display subpixel arranged adjacent to the at least one virtual subpixel and arranged in a same row as the virtual subpixel in the second direction.

In a possible embodiment of the present disclosure, the first potential signal line pattern includes a first power source signal line pattern. The virtual subpixel driving circuit further includes a first storage capacitor, the gate electrode of the virtual driving transistor is reused as a first electrode plate of the first storage capacitor, a second electrode plate of the first storage capacitor is located at a side of the first electrode plate away from the base substrate, an orthogonal projection of the second electrode plate onto the base substrate overlaps an orthogonal projection of a first portion of the first power source signal line pattern extending in the first direction onto the base substrate at an overlapping region where the second electrode plate is coupled to the first portion. The display subpixel further includes a second power source signal line pattern including a third portion extending in the first direction. The display subpixel driving circuit further includes a second storage capacitor, the gate electrode of the driving transistor is reused as a third electrode plate of the second storage capacitor, a fourth electrode plate of the second storage capacitor is located at a side of the third electrode plate away from the base substrate, and an orthogonal projection of the fourth electrode plate onto the base substrate overlaps an orthogonal projection of the third portion of the second power source signal line pattern onto the base substrate at an overlapping region where the fourth electrode plate is coupled to the third portion. The second electrode plate in each of the virtual subpixels arranged in a same row in the second direction is formed integrally with the fourth electrode plate in the corresponding display subpixel in the row.

In a possible embodiment of the present disclosure, the display subpixel includes a second power source signal line pattern including a third portion extending in the first direction, and the first portion of the first power source signal line pattern in each of the virtual subpixels in a same column in the first direction is formed integrally with the third portion of the second power source signal line pattern in the corresponding display subpixel in the column.

In a possible embodiment of the present disclosure, the virtual subpixel further includes a first data line pattern extending in the first direction, the display subpixel includes a second data line pattern extending in the first direction, and the first data line pattern in each of the virtual subpixels in a same column in the first direction is formed integrally with the second data line pattern in the corresponding display subpixel in the column.

In a possible embodiment of the present disclosure, the virtual subpixel includes an active layer pattern, the active layer pattern includes: a first active sub-pattern and a second active sub-pattern arranged opposite to each other and each extending in the first direction; and a third active sub-pattern arranged between the first active sub-pattern and the second active sub-pattern. Two ends of the third active sub-pattern are coupled to the first active sub-pattern and the second active sub-pattern respectively, an orthogonal projection of at least a part of the third active sub-pattern onto the base substrate overlaps the orthogonal projection of the gate electrode of the virtual driving transistor onto the base substrate, and an orthogonal projection of a portion of the first conductive connection member away from the gate electrode of the virtual driving transistor onto the base substrate does not overlap an orthogonal projection of the active layer pattern onto the base substrate.

In a possible embodiment of the present disclosure, the virtual subpixel further includes a first data line pattern extending in the first direction, an orthogonal projection of the second active sub-pattern onto the base substrate is located between an orthogonal projection of the first data line pattern onto the base substrate and an orthogonal projection of the first active sub-pattern onto the base substrate, and the orthogonal projection of the first data line pattern onto the base substrate does not overlap the orthogonal projection of the active layer pattern onto the base substrate.

In a possible embodiment of the present disclosure, the first potential signal line pattern includes a first power source signal line pattern. The virtual subpixel further includes a first data line pattern, a first gate line pattern, a first light-emission control signal line pattern, a first resetting signal line pattern and a first initialization signal line pattern, at least a part of the first power source signal line pattern and the first data line pattern extend in the first direction, and the first gate line pattern, the first light-emission control signal line pattern, the first resetting signal line pattern and the first initialization signal line pattern extend in the second direction. The virtual subpixel driving circuit further includes a second virtual transistor, a fifth virtual transistor and a sixth virtual transistor, the gate electrode of the virtual driving transistor is coupled to the first power source signal line pattern, a first electrode of the virtual driving transistor is coupled to a second electrode of the fifth virtual transistor, and a second electrode of the virtual driving transistor is coupled to a first electrode of the sixth virtual transistor. A gate electrode of the second virtual transistor is coupled to the first resetting signal line pattern, a first electrode of the second virtual transistor is coupled to the first initialization signal line pattern, and a second electrode of the second virtual transistor is in a floating state. A gate electrode of the fifth virtual transistor is coupled to the first light-emission control signal line pattern, a first electrode of the fifth virtual transistor is coupled to the first power source signal line pattern, and a gate electrode of the sixth virtual transistor is coupled to the first light-emission control signal line pattern.

In a possible embodiment of the present disclosure, the display subpixel driving circuit further includes a third conductive connection member extending in the first direction, a first end of the third conductive connection member is coupled to the gate electrode of the driving transistor, and a second end of the third conductive connection member is coupled to the second electrode of the first transistor and the second electrode of the second transistor.

In a possible embodiment of the present disclosure, the second electrode of the first transistor is coupled to the second electrode of the second transistor to form a common connection end, and an orthogonal projection of the second end of the third conductive connection member onto the base substrate overlaps an orthogonal projection of the common connection end onto the base substrate at an overlapping region where the second end of the third conductive connection member is coupled to the common connection end.

In a possible embodiment of the present disclosure, the display subpixel includes a second power source signal line pattern, a second data line pattern, a second gate line pattern, a second light-emission control signal line pattern, a second resetting signal line pattern, a third resetting signal line pattern, a second initialization signal line pattern and a third initialization signal line pattern. At least a part of the second power source signal line pattern and the second data line pattern extend in a first direction, and the second gate line pattern, the second light-emission control signal line pattern, the second resetting signal line pattern, the third resetting signal line pattern, the second initialization signal line pattern and the third initialization signal line pattern extend in a second direction intersecting the first direction. The display subpixel driving circuit further includes a fourth transistor, a fifth transistor, a sixth transistor and a seventh transistor. A first electrode of the driving transistor is coupled to a second electrode of the fifth transistor, a second electrode of the driving transistor is coupled to a first electrode of the first transistor, and a gate electrode of the first transistor is coupled to the second gate line pattern. A gate electrode of the second transistor is coupled to the second resetting signal line pattern, and a first electrode of the second transistor is coupled to the second initialization signal line pattern. A gate electrode of the fourth transistor is coupled to the second gate line pattern, a first electrode of the fourth transistor is coupled to the second data line pattern, and a second electrode of the fourth transistor is coupled to the first electrode of the driving transistor. A gate electrode of the fifth transistor is coupled to the second light-emission control signal line pattern, and a first electrode of the fifth transistor is coupled to the second power source signal line pattern. A gate electrode of the sixth transistor is coupled to the second light-emission control signal line pattern, a first electrode of the sixth transistor is coupled to the second electrode of the driving transistor, and a second electrode of the sixth transistor is coupled to a light-emitting element in the display subpixel. A second electrode of the seventh transistor is coupled to the light-emitting element in the display subpixel, a gate electrode of the seventh transistor is coupled to the third resetting signal line pattern, and a first electrode of the seventh transistor is coupled to the third initialization signal line pattern.

In a possible embodiment of the present disclosure, the first conductive connection member and the second conductive connection member are formed integrally.

In another aspect, the present disclosure provides in some embodiments a display device including the above-mentioned display substrate.

In yet another aspect, the present disclosure provides in some embodiments a method for manufacturing a display substrate, including forming a plurality of subpixels in an array form on a base substrate. The plurality of subpixels includes a plurality of display subpixels at a display region of the display substrate and a plurality of virtual subpixels, and at least a part of the virtual subpixels are arranged adjacent to the display subpixels. The display subpixel includes a display subpixel driving circuit, and the display subpixel driving circuit includes a driving transistor, a first transistor and a second transistor. A gate electrode of the driving transistor is coupled to a second electrode of the first transistor and a second electrode of the second transistor. The virtual subpixel includes a first potential signal line pattern, a virtual subpixel driving circuit including a virtual driving transistor and a first conductive connection member coupled to a gate electrode of the virtual driving transistor, and a second conductive connection member coupled to the first conductive connection member and the first potential signal line pattern.

In a possible embodiment of the present disclosure, the first potential signal line pattern includes a first power source signal line pattern, and the forming the first conductive connection member, the second conductive connection member and the first potential signal line pattern includes forming first conductive connection member, the second conductive connection member and the first potential signal line pattern integrally through a single patterning process.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

Figure 1:
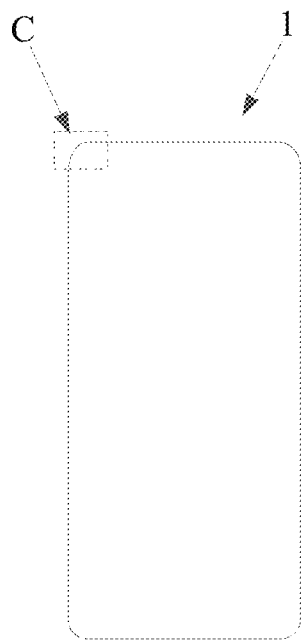
FIG. 1 is a schematic view showing a display substrate according to one embodiment of the present disclosure.
Figure 2:
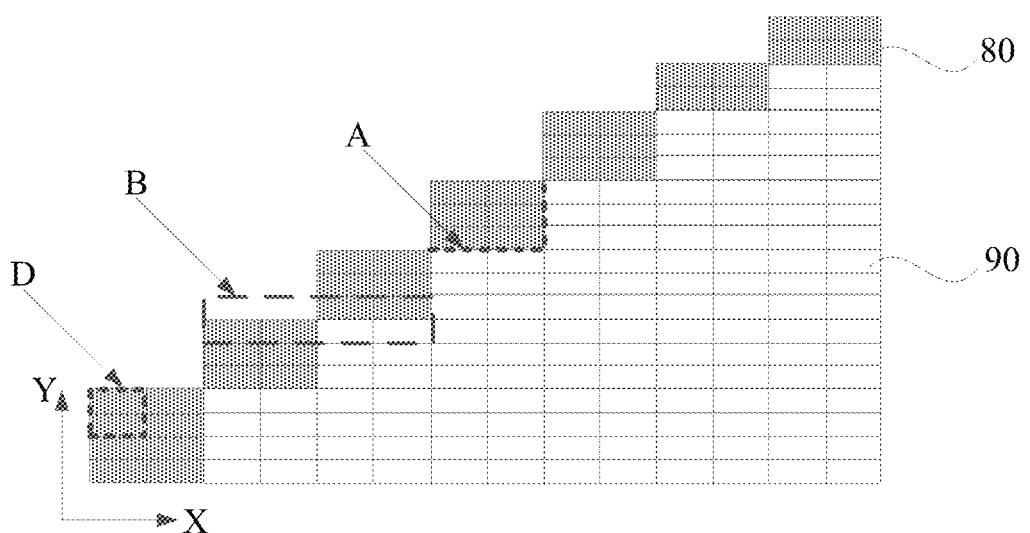
FIG. 2 is an enlarged view of C in FIG. 1.

The present disclosure will be described hereinafter in conjunction with the drawings and embodiments.

The present disclosure provides in some embodiments a display substrate, which includes a display region and a non-display region surrounding the display region. The display region includes a central portion and a peripheral portion. The peripheral portion is a portion of the display region adjacent to a boundary of the display region. Taking a rectangular display region with rounded corners as an example, the peripheral region includes portions at upper, lower, left and right sides of the display region, and portions at the four rounded corners of the display region.

During the actual arrangement of the display region, in order to ensure the uniformity of the process of the display substrate, virtual subpixels may be arranged outside normal display subpixels at a periphery of the display region. No organic light-emitting material may be evaporated for these virtual subpixels, i.e., these virtual subpixels may not emit light. These virtual subpixels function as to ensure etching uniformity when etching circuits for the normal display subpixels in an etching process, so as to prevent a change in a width of each line and a change a distance between the lines in a local area for the display subpixels at the periphery due to etching non-uniformity.

During the actual arrangement of the virtual subpixels and the display subpixels, there is a relatively small arrangement space at the periphery of the display region, so it is difficult to arrange the virtual subpixels with a completely same structure as the display subpixels. Hence, during the arrangement of the virtual subpixels, a structure of a virtual subpixel driving circuit corresponding to the virtual subpixel is simpler than that of a normal display subpixel driving circuit. However, the virtual subpixels in the display substrate do not exist independently, and the writing of a signal is the same as that for the normal display subpixel, so it is impossible for the simplified virtual subpixel driving circuit in the virtual subpixel to ensure the stability of the virtual subpixel in a driving procedure, and floating nodes may probably exist in the virtual subpixel driving circuit. At this time, the operating stability as well as the display quality of the display substrate may be adversely affected.

The structures of the display subpixel and the virtual subpixel will be described hereinafter when the display subpixel includes a 7T1C (i.e., 7 thin film transistors and 1 capacitor)-based display subpixel driving circuit.

As shown in FIGS. 1, 2, 4, 5 and 13*d*, each virtual subpixel 80 may include a first data line pattern 808, a first gate line pattern 802, a first light-emission control signal line pattern 803, a first resetting signal line pattern 805 and a first initialization signal pattern 804. At least a part of the first power source signal line pattern (e.g., a first portion 8011) and the first data line pattern 808 may extend in a first direction (e.g., a direction Y), and the first gate line pattern 802, the first light-emission control signal line pattern 803, the first resetting signal line pattern 805 and the first initialization signal line pattern 804 may extend in a second direction (e.g., a direction X).

The virtual subpixel driving circuit in each virtual subpixel 80 may include a virtual driving transistor (i.e., a third virtual transistor T3'), a second virtual transistor T2', a fifth virtual transistor T5', a sixth virtual transistor T6', a seventh virtual transistor T7' and a first storage capacitor Cst'. It should be appreciated that, the word "virtual" in the virtual driving transistor and the virtual transistor may be understood as "existing virtually", i.e., the virtual driving transistor and the virtual transistor may not be used to drive a light-emitting layer to emit light.

The second virtual transistor T2' may be of a double-gate structure. A gate electrode 202*g*' of the second virtual transistor T2' may be coupled to the first resetting signal line pattern 805, a source electrode S2' of the second virtual transistor T2' may be coupled to the first initialization signal line pattern 804, and a drain electrode D2' of the second virtual transistor T2' may be in a floating state.

A gate electrode 205*g*' of the fifth virtual transistor T5' may be coupled to the first light-emission control signal line pattern 803, a source electrode S5' of the fifth virtual transistor T5' may be coupled to the first power source signal line pattern 801, and a drain electrode D5' of the fifth virtual transistor T5' may be coupled to a source electrode S3' of the third virtual transistor T3'.

A gate electrode 206*g*' of the sixth virtual transistor T6' may be coupled to the first light-emission control signal line pattern 803, a source electrode S6' of the sixth virtual transistor T6' may be coupled to a drain electrode D3' of the third virtual transistor T3', and a drain electrode D6' of the sixth virtual transistor T6' may be coupled to an anode of a light-emitting element EL.

A gate electrode 207*g*' of the seventh virtual transistor T7' may be coupled to the first resetting signal line pattern 805' in a next virtual subpixel 80 in the first direction, a drain electrode D7' of the seventh virtual transistor T7' may be coupled to the anode of the light-emitting element EL, a source electrode S7' of the seventh virtual transistor T7' may be coupled to the first initialization signal line pattern 804' in the next virtual subpixel 80 in the first direction, and a cathode of the light-emitting element EL may be coupled to a negative power source signal line VSS.

A first electrode plate Cst1' of the first storage capacitor Cst' may be reused as a gate electrode 203*g*' of the third virtual transistor T3', and a second electrode plate Cst2' of the first storage capacitor Cst' may be coupled to the first power source signal line pattern 801.

Figure 4:
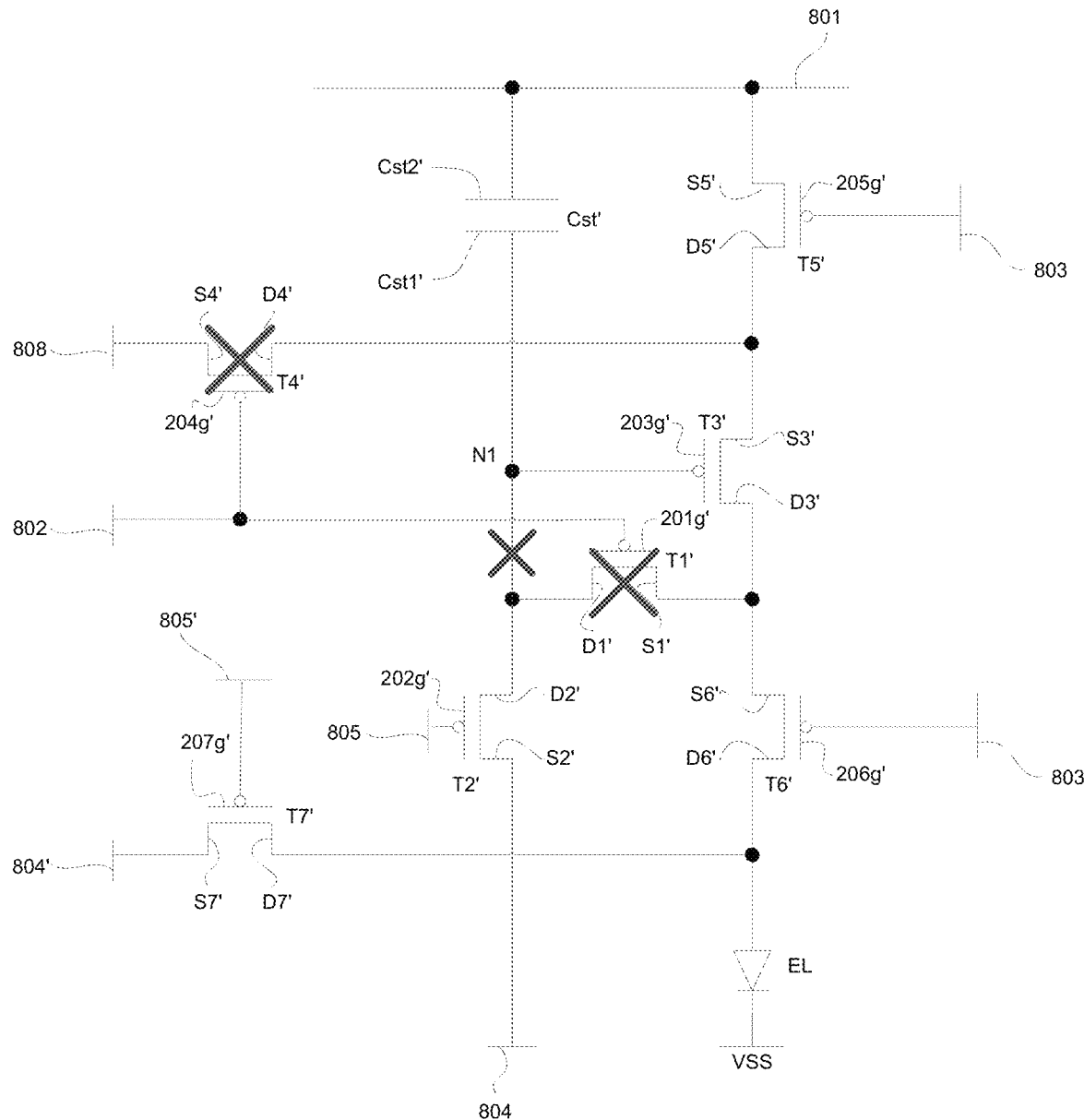
FIG. 4 is a schematic view showing a structure of a virtual subpixel driving circuit according to one embodiment of the present disclosure.
Figure 5:
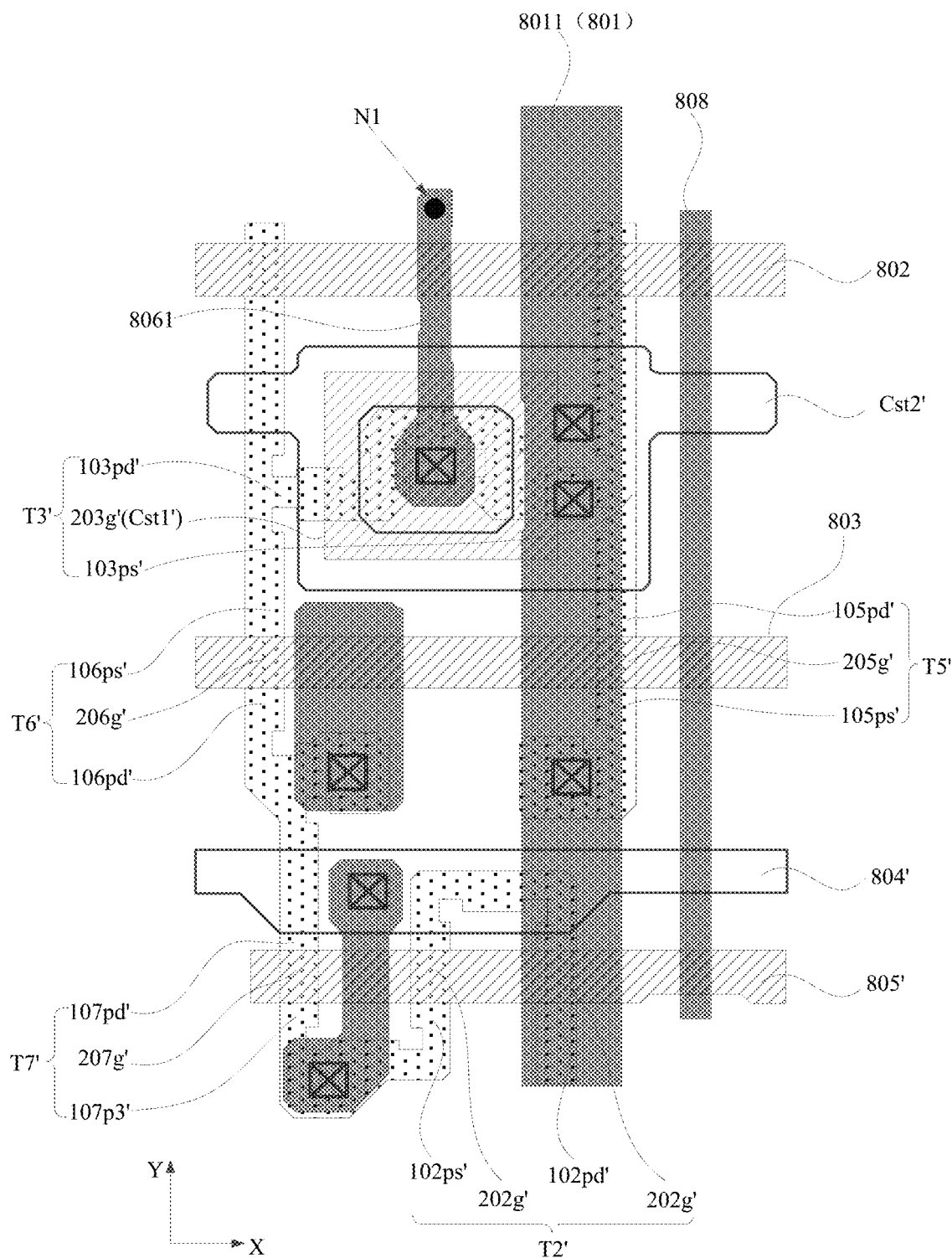
FIG. 5 is a schematic view showing layout of the virtual subpixel driving circuit according to one embodiment of the present disclosure.

It should be appreciated that, as shown in FIG. 4, the virtual subpixel driving circuit does not include a first virtual transistor T1' and a fourth virtual transistor T4', so it is impossible for a data signal applied by the first data line pattern 808 to be transmitted through the fourth virtual transistor T4', the third virtual transistor T3' and the first virtual transistor T1' to a node N1. At this time, the node N1 may be in a floating state. It should be further appreciated that, the gate electrode of the virtual driving transistor may be coupled to the node N1.

In the virtual subpixel driving circuit, the node N1 may be coupled to the first power source signal line pattern through the first storage capacitor Cst' and any other parasitic capacitor in the virtual subpixel driving circuit, so a change in a voltage at the node N1 may lead to a change in a voltage across the first power source signal line pattern 801. In addition, the change in the voltage across the first power signal line pattern 801 may lead to a change in a voltage across a second power source signal line pattern 901 in the display subpixel 90, and the voltage VDD across the second power source signal line pattern 901 may influence a current passing through a light-emitting element in the display subpixel 90 and thereby influence the normal light emission of the light-emitting element in the display subpixel 90. At this time, such a phenomenon as non-uniform display brightness at a local region may occur for the display substrate.

In detail, a current I passing through the light-emitting element in the display subpixel 90 may meet the following equation: I=½*K(Vdata−VDD)2, where K is a constant, and Vdata represents a data voltage. Hence, when VDD changes, the current I may change too, and thereby light-emission efficiency of the light-emitting element may be adversely affected.

Based on the above analysis, the voltage at the node N1 in the virtual subpixel driving circuit plays a very important role in the operation of the entire display subpixel driving circuit, and it is an important factor for the operating performance of the display subpixel driving circuit. Hence, it has currently become a focus to improve the yield as well as the competitiveness of a display product through the design and improvement of the node N1.

As shown in FIGS. 1, 2, 6 and 7, the present disclosure provides in some embodiments a display substrate 1, which includes a base substrate and a plurality of subpixels arranged on the base substrate in an array form. The plurality of subpixels includes a plurality of display subpixels 90 at a display region of the display panel and a plurality of virtual subpixels 80, and at least a part of the virtual subpixels are arranged adjacent to the display subpixels. Each display subpixel 90 includes a display subpixel driving circuit, and the display subpixel driving circuit includes a driving transistor (i.e., a third transistor T3), a first transistor T1 and a second transistor T2. A gate electrode of the driving transistor is coupled to a second electrode (i.e., a drain electrode D1) of the first transistor T1 and a second electrode (i.e., a drain electrode D2) of the second transistor. Each virtual subpixel 80 includes a first potential signal line pattern, a virtual subpixel driving circuit, and a second conductive connection member 8062. The virtual subpixel driving circuit includes a virtual driving transistor and a first conductive connection member 8061 coupled to a gate electrode of the virtual driving transistor. The second conductive connection member 8062 is coupled to the first conductive connection member 8061 and the first potential signal line pattern.

To be specific, the plurality of virtual subpixels 80 of the display substrate 1 may be arranged along boundaries of the plurality of display subpixels 90, and at a certain boundary, the virtual subpixels 80 may be arranged in the first direction and the second direction. For example, at a boundary A in FIG. 2, three virtual subpixels 80 may be arranged in the first direction, and two virtual subpixels 80 may be arranged in the second direction.

Figure 7:
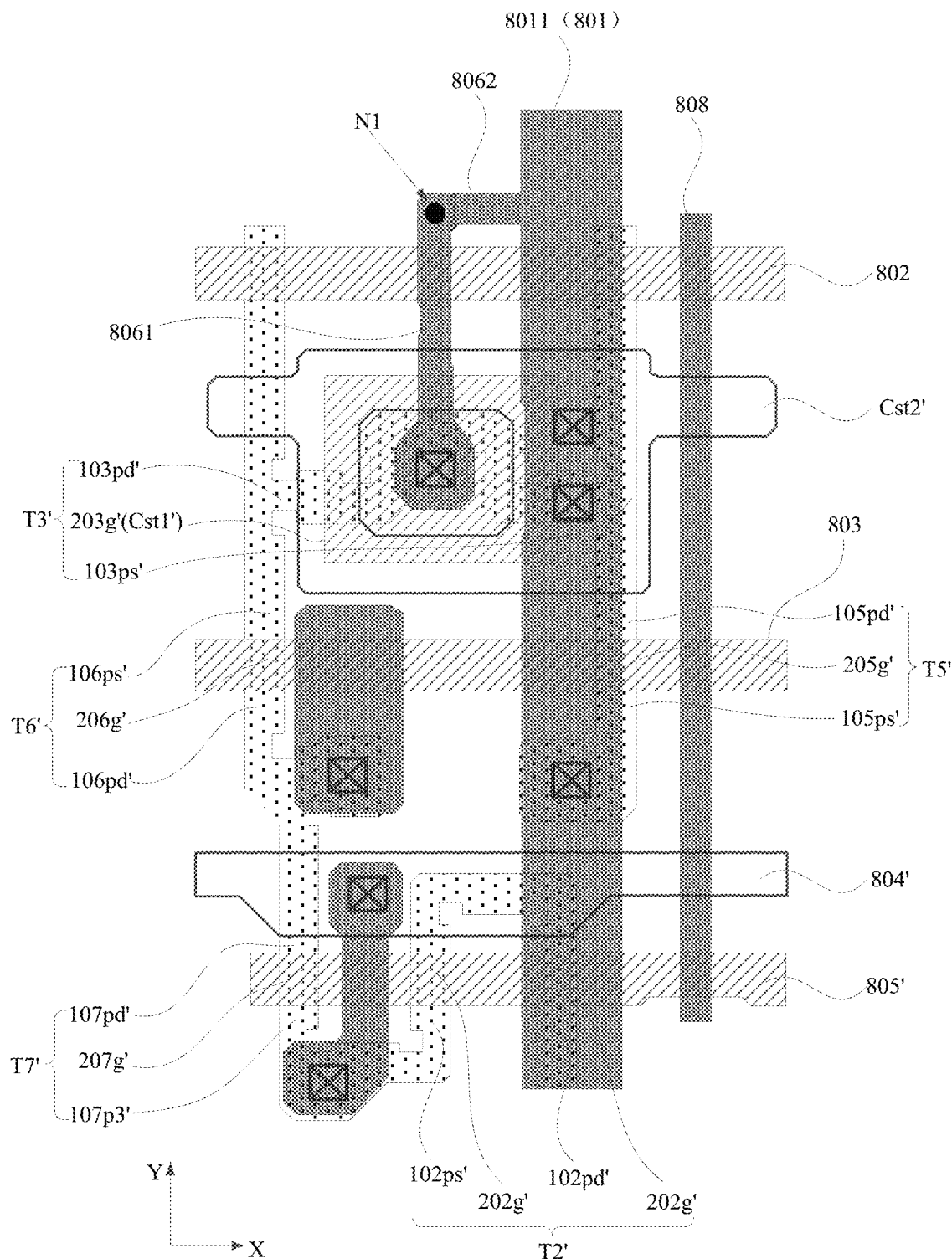
FIG. 7 is another schematic view showing the layout of the virtual subpixel driving circuit according to one embodiment of the present disclosure.

As shown in FIG. 7, the virtual subpixel driving circuit may include the virtual driving transistor and the first conductive connection member 8061, one end of the first conductive connection member 8061 may be coupled to the gate electrode of the virtual driving transistor, and a potential at the first conductive connection member 8061 may be just the potential at the node N1.

Each virtual subpixel 80 may further include the first potential signal line pattern and the second conductive connection member 8062. In a same virtual subpixel 80, one end of the second conductive connection member 8062 may be coupled to the other end of the first conductive connection member 8061, and the other end of the second conductive connection member 8062 may be coupled to the first potential signal line pattern, so as to maintain the node N1 at a same potential as the first potential signal line pattern.

It should be appreciated that, the word "couple" includes direct electrical connection, or indirect electrical connection through a conductive layer.

For example, the first conductive connection member 8061 and the second conductive connection member 8062 may be formed integrally. It should be appreciated that, a resultant integral structure may include the first conductive connection member 8061 and the second conductive connection member 8062 made of a same material through a single patterning process and in contact with each other, or the first conductive connection member 8061 may be in direct contact with the second conductive connection member 8062.

For example, the first conductive connection member 8061 may extend in the first direction, and the second conductive connection member 8062 may extend in the second direction. A width of the first conductive connection member 8061 in a direction perpendicular to the first direction may be smaller than a width of the second conductive connection member 8062 in a direction perpendicular to the second direction. When the first potential signal line pattern includes a first power source signal line pattern 801, it is able to reduce a resistance of the first power source signal line pattern 801 in a better manner.

For example, the first conductive connection member 8061 may extend in the first direction, and the second conductive connection member 8062 may extend in the second direction. A width of the first conductive connection member 8061 in the direction perpendicular to the first direction may be equal to a width of the second conductive connection member 8062 in the direction perpendicular to the second direction.

For example, an orthogonal projection of the first conductive connection member 8061 onto the base substrate may overlap an orthogonal projection of a first gate line pattern 802 onto the base substrate at a first overlapping region, and a width of a part of the first conductive connection member 8061 at the first overlapping region in the direction perpendicular to the first direction may be smaller than a width of the other part of the first conductive connection member 8061 in the direction perpendicular to the first direction.

For example, an orthogonal projection of the second conductive connection member 8062 onto the base substrate may overlap the orthogonal projection of the first gate line pattern 802 onto the base substrate at a second overlapping region, and a width of a part of the second conductive connection member 8062 at the second overlapping region in the direction perpendicular to the second direction may be smaller than a width of the other part of the second conductive connection member 8062 in the direction perpendicular to the second direction.

For example, an orthogonal projection of the first power source signal line pattern 801 onto the base substrate may overlap the orthogonal projection of the first gate line pattern 802 onto the base substrate at a third overlapping region, and a width of a part of the first power source signal line pattern 801 at the third overlapping region in the direction perpendicular to the first direction may be smaller than a width of the other part of the first power source signal line pattern 801 in the direction perpendicular to the first direction.

In the above-mentioned arrangement modes, it is able to reduce an overlapping area between the first gate line pattern 802 and the first conductive connection member 8061, the second conductive connection member 8062 and/or the first power source signal line 801 in a better manner, thereby to reduce a load of the first gate line pattern 802 in a better manner.

For example, the first conductive connection member 8061 and the second conductive connection member 8062 may be arranged at different layers.

For example, the first conductive connection member 8061 and the first power source signal line pattern 801 may be arranged at a same layer, and the first conductive connection member 8061 and the second conductive connection member 8062 may be arranged at different layers.

For example, the first potential signal line pattern may include a first initialization signal line pattern, one end of the second conductive connection member 8062 may be coupled to the other end of the first conductive connection member 8061, and the other end of the second conductive connection member 8062 may be coupled to the first initialization signal line pattern, so as to maintain the node N1 at a same potential as the first initialization signal line pattern.

For example, the first potential signal line pattern may include the first power source signal line pattern 801. In a same virtual subpixel 80, one end of the second conductive connection member 8062 may be coupled to the other end of the first conductive connection member 8061, and the other end of the second conductive connection member 8062 may be coupled to the first power source signal line pattern 801, so as to maintain the node N1 at a same potential as the first power source signal line pattern 801.

Based on the specific structure of the display substrate, in the display substrate 1 according to the embodiments of the present disclosure, the second conductive connection member 8062 may be provided to couple the first conductive connection member 8061 to the first potential signal line pattern, so as to maintain the node N1 in the virtual subpixel driving circuit at a same stable potential as the first potential signal line pattern all the time, thereby to prevent the occurrence of such a phenomenon as display brightness non-uniformity at a local area of the display substrate 1 due to a floating state of the node N1.

The first conductive connection member 8061, the first potential signal line pattern and the second conductive connection member 8062 may each be of various structures. In some embodiments of the present disclosure, the first potential signal line pattern may include a first power source signal line pattern 801, the first conductive connection member 8061 may extend in a first direction, the first power source signal line pattern 801 may include a first portion 8011 extending in the first direction, the second conductive connection member 8062 may extend in a second direction intersecting the first direction, and the second conductive connection member 8062 may be coupled to the first conductive connection member 8061 and the first portion 8011 of the first power source signal line pattern 801.

To be specific, the first conductive connection member 8061 may extend in the first direction, the first portion 8011 of the first power source signal line pattern 801 may extend in the first direction, and the first conductive connection member 8061 and the first power source signal line pattern 801 may be arranged in the first direction.

In addition, the second conductive connection member 8062 may extend in the second direction, an orthogonal projection of the second conductive connection member 8062 onto the base substrate may be located between an orthogonal projection of the first conductive connection member 8061 onto the base substrate and an orthogonal projection of the first portion 8011 of the first power source signal line pattern 801 onto the base substrate, one end of the second conductive connection member 8062 adjacent to the first conductive connection member 8061 may be coupled to the first conductive connection member 8061, and one end of the second conductive connection member 8062 adjacent to the first portion 8011 may be coupled to the first power source signal line pattern 801.

Figure 12:
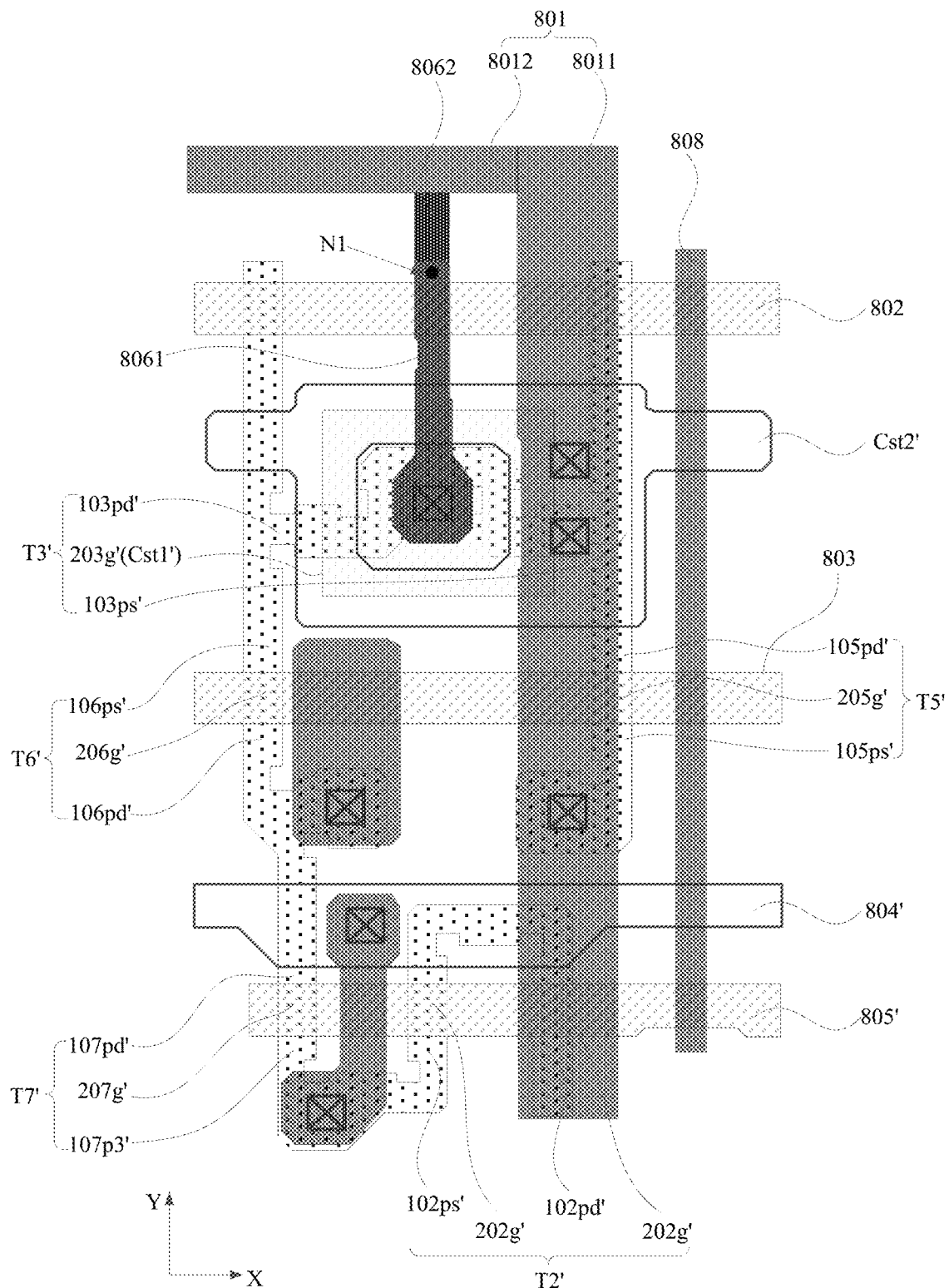
FIG. 12 is yet another schematic view showing the layout of the virtual subpixel driving circuit according to one embodiment of the present disclosure.

As shown in FIG. 12, in some other embodiments of the present disclosure, the first potential signal line pattern may include a first power source signal line pattern 801, the first power source signal line pattern 801 may include a first portion 8011 and a second portion 8012 coupled to each other, the first portion 8011 may extend in a first direction, the second portion 8012 may extend in a second direction intersecting the first direction, the first conductive connection member 8061 may extend in the first direction, and the second conductive connection member 8062 may extend in the first direction and may be coupled to the first conductive connection member 8061 and the second portion 8012 of the first power source signal line pattern 801.

To be specific, the first power source signal line pattern 801 may include the first portion 8011 and the second portion 8012 coupled to each other. The first power source signal line pattern 801 with this kind of structure may have a relatively large area, so it is able to reduce a voltage drop generated on the first power source signal line pattern 801 in a better manner.

In addition, the second portion 8012 of the first power source signal line pattern may extend in the second direction, the first conductive connection member 8061 and the second conductive connection member 8062 may each extend in the first direction, an orthogonal projection of the second conductive connection member 8062 onto the base substrate may be located between an orthogonal projection of the first conductive connection member 8061 onto the base substrate and an orthogonal projection of the second portion 8012 of the first power source signal line pattern 801 onto the base substrate, one end of the second conductive connection member 8062 adjacent to the first conductive connection member 8061 may be coupled to the first conductive connection member 8061, and one end of the second conductive connection member 8062 adjacent to the second portion 8012 may be coupled to the second portion 8012.

It should be appreciated that, in the embodiments of the present disclosure, the first direction may be optionally a direction Y, and the second direction may be optionally a direction X.

When the first power source signal line pattern 801, the first conductive connection member 8061 and the second conductive connection member 8062 have the above-mentioned structures, it is able to reduce a layout space occupied by the second conductive connection member 8062 to the greatest extent, thereby to reduce a layout space occupied by the virtual subpixel 80 as a whole in a better manner and increase a resolution of the display substrate.

Figure 13A:
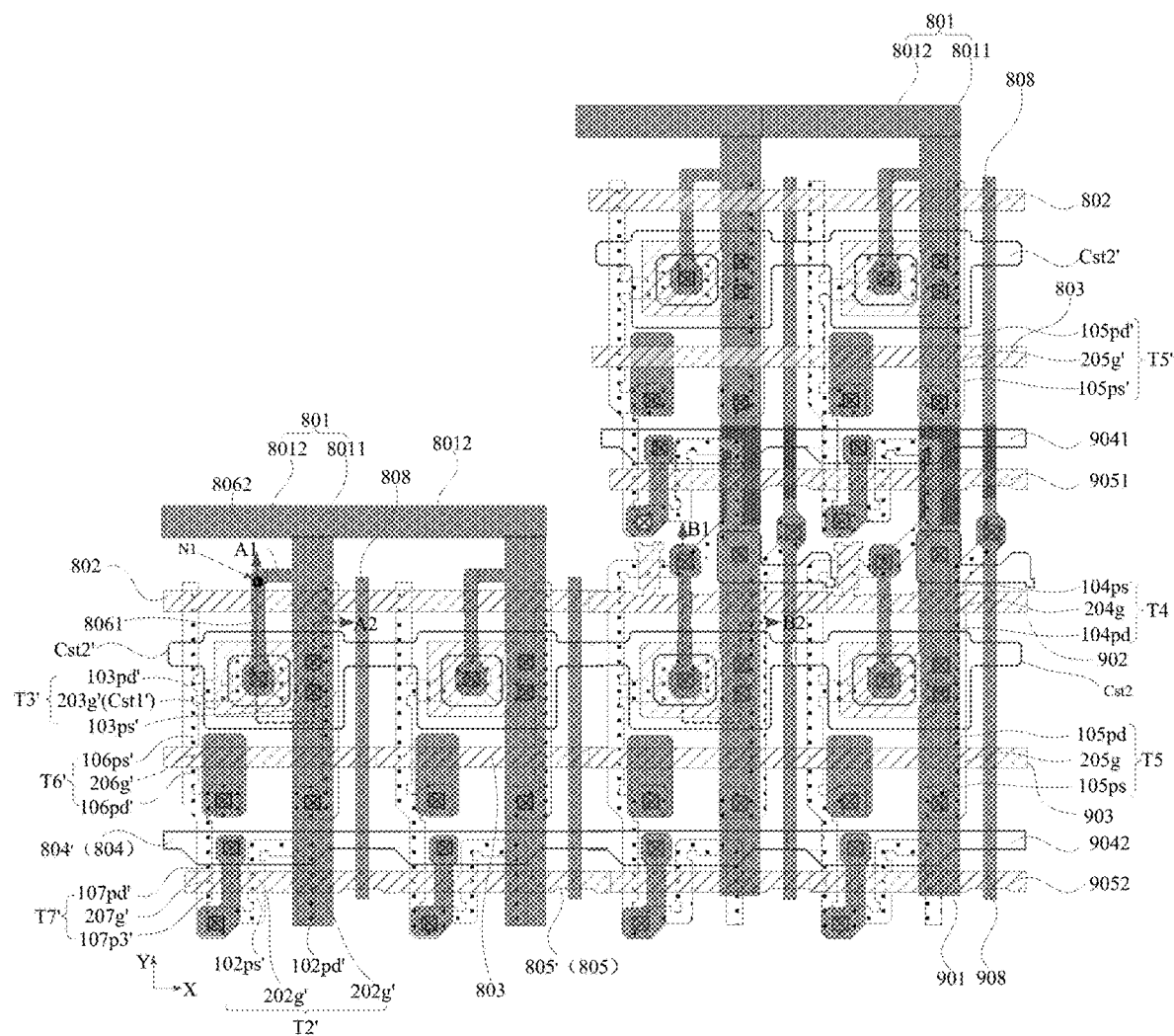
FIG. 13a is an enlarged view of B in FIG. 2.

As shown in FIG. 13*a*, in some embodiments of the present disclosure, the second portions 8012 in at least two virtual subpixels 80 may be coupled to each other in the second direction.

To be specific, the plurality of subpixels in the display substrate may be arranged in an array form, i.e., arranged in rows and columns, and the rows of subpixels may be arranged sequentially in the first direction. Each row of subpixels may include a plurality of subpixels arranged sequentially in the second direction, and these subpixels may include the virtual subpixels 80 arranged at a peripheral region and the display subpixels 90 arranged at a central region. The columns of subpixels may be arranged sequentially in the second direction, each column of subpixels may include a plurality of subpixels arranged sequentially in the first direction, and these subpixels may include the virtual subpixels 80 arranged at a peripheral region and the display subpixels 90 arranged at a central region.

For example, the second portions 8012 in the virtual subpixels 80 in a same row may be sequentially coupled to each other in the second direction.

When the second portions 8012 in the at least two virtual subpixels 80 are coupled to each other in the second direction, the first power source signal line patterns of at least a part of the virtual subpixels 80 in the display substrate may form a large-size web-like structure, so it is able to reduce the voltage drop on the first power source signal line pattern 801 in a better manner, thereby to improve the display quality of the display substrate.

It should be appreciated that, the virtual subpixels 80 coupled to each other in the second direction may be arranged at a same side of the display substrate. For example, at a left or right side of the display substrate, the second portions 8012 in the virtual subpixels 80 in each row may be sequentially coupled to each other in the second direction.

Figure 3:
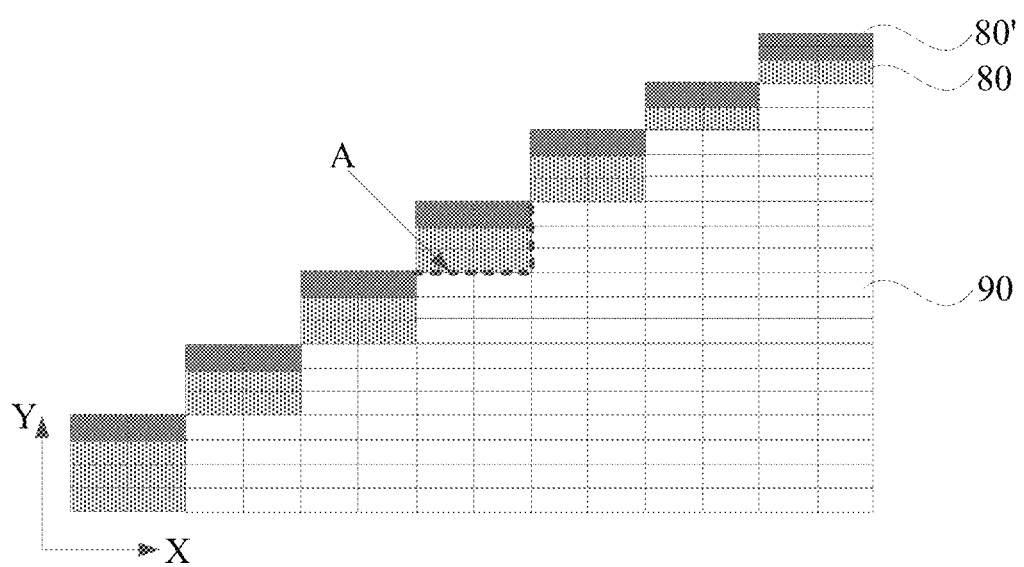
FIG. 3 is another enlarged view of C in FIG. 1.

As shown in FIG. 3, in some embodiments of the present disclosure, the first portion 8011 and the second portion 8012 in at least one target virtual subpixel 80' may be formed integrally, and the target virtual subpixel 80' may be an outermost virtual subpixel 80 arranged at the display region in the first direction.

To be specific, as shown in FIG. 13a, when the first portion 8011 and the second portion 8012 in each of the plurality of target virtual subpixels 80' in a same row are formed integrally, a length of a first data line pattern 808 of the target virtual subpixel 80' may be reduced in the first direction, so as to prevent the occurrence of a short circuit between the first data line pattern 808 and the second portion 8012.

For example, the first portion 8011 and the second portion 8012 in each target virtual subpixel 80' may be formed integrally.

For example, the first portion 8011 and the second portion 8012 in each of the target virtual subpixels 80' in the same row may be formed integrally in the second direction.

In addition, it should be appreciated that, the target virtual subpixel 80' may not include the first initialization signal line pattern 804, the first resetting signal line pattern 805 and the second virtual transistor T2'.

As shown in FIGS. 7 and 12, in some embodiments of the present disclosure, the first potential signal line pattern may include a first power source signal line pattern 801, and the first conductive connection member 8061, the second conductive connection member 8062 and the first power source signal line pattern 801 may be formed integrally.

When the first conductive connection member 8061, the second conductive connection member 8062 and the first power source signal line pattern 801 are formed integrally, it is able to form them simultaneously through a single patterning process, thereby to simplify a manufacture process of the display substrate and reduce the manufacture cost thereof.

It should be appreciated that, the first conductive connection member 8061, the second conductive connection member 8062 and the first power source signal line pattern 801 may each be made of a first source-drain metal layer of the display substrate.

As shown in FIGS. 7 and 12, in some embodiments of the present disclosure, each virtual subpixel 80 may further include a first gate line pattern 802 and a first light-emission control signal line pattern 803 extending in the second direction. The first gate line pattern 802 and the first light-emission control signal line pattern 803 may be arranged in the first direction, an orthogonal projection of the gate electrode of the virtual driving transistor onto the base substrate may be located between an orthogonal projection of the first gate line pattern 802 onto the base substrate and an orthogonal projection of the first light-emission control signal line pattern 803 onto the base substrate, and the orthogonal projection of the first gate line pattern 802 onto the base substrate may be located between an orthogonal projection of the second conductive connection member 8062 onto the base substrate and the orthogonal projection of the first light-emission control signal line pattern 803 onto the base substrate.

To be specific, the second conductive connection member 8062 may be arranged at various positions. For example, the orthogonal projection of the first gate line pattern 802 onto the base substrate may be located between the orthogonal projection of the second conductive connection member 8062 onto the base substrate and the orthogonal projection of the first light-emission control signal line pattern 803 onto the base substrate. In this way, the second conductive connection member 8062 may be located at a side of the first gate line pattern 802 away from the first light-emission control signal line pattern 803 and the virtual driving transistor, so as to provide a larger layout space for the second conductive connection member 8062, and prevent the occurrence of a short circuit between the second conductive connection member 8062 and any conductive structure other than the first conductive connection member 8061 and the first power source signal line pattern 801 in a better manner, thereby to improve the stability of the display substrate in a better manner.

Figure 15:
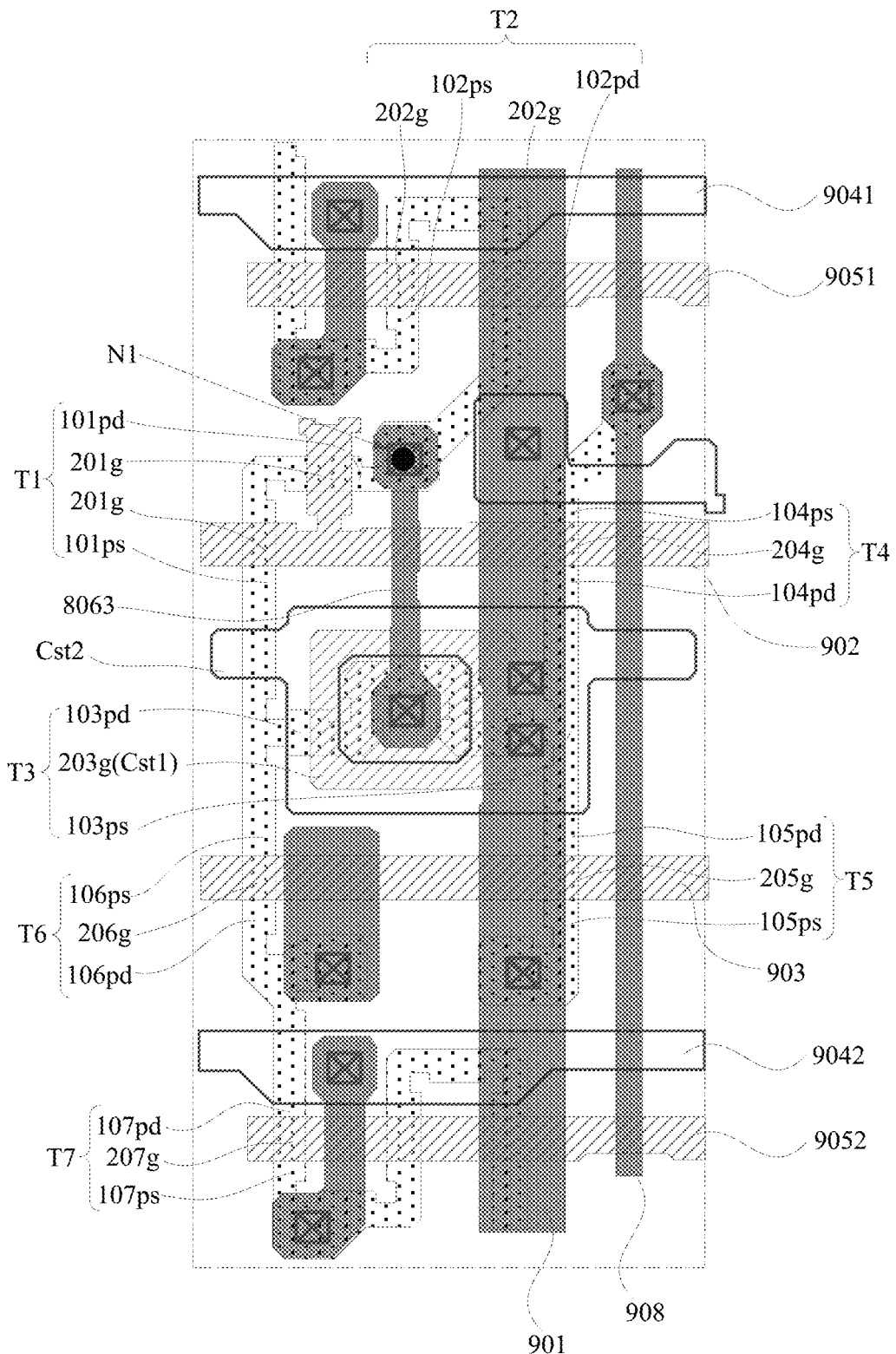
FIG. 15 is a schematic view showing layout of the display subpixel driving circuit according to one embodiment of the present disclosure.

As shown in FIGS. 13a and 15, in some embodiments of the present disclosure, each display subpixel 90 may include a second gate line pattern 902 and a second light-emission control signal line pattern 903 each extending in the second direction. The first gate line pattern 802 in at least one virtual subpixel 80 in the second direction may be formed integrally with the second gate line pattern 902 in a display subpixel 90 arranged adjacent to the at least one virtual subpixel 80 and arranged in a same row as the virtual subpixel 80 in the second direction. The first light-emission control signal line pattern 803 in at least one virtual subpixel 80 in the second direction may be formed integrally with the second light-emission control signal line pattern 903 in a display subpixel 90 arranged adjacent to the at least one virtual subpixel and arranged in a same row as the virtual subpixel in the second direction.

To be specific, each display subpixel 90 may include the second gate line pattern 902 and the second light-emission control signal line pattern 903, the second gate line pattern 902 may be arranged opposite to the second light-emission control signal line pattern 903 in the first direction, and at least a part of the second gate line pattern 902 may be extend in the second direction.

During the arrangement of the virtual subpixels 80 and the display subpixels 90, for example, the first gate line patterns 802 in the virtual subpixels in a same row and the second gate line patterns 902 in the display subpixels 90 in the row may be arranged along a same straight line in the second direction. Identically, the first light-emission control signal line patterns 803 in the virtual subpixels 80 in a same row and the second light-emission control signal line patterns 903 in the display subpixels 90 in the row may be arranged along a same straight line in the second direction.

For example, the first gate line patterns 802 in the virtual subpixels 80 in a same row may be sequentially coupled to the second gate line patterns 902 in the display subpixels 90 in the row in the second direction to form an integral structure. The first light-emission control signal line patterns 803 in the virtual subpixels 80 in a same row may be sequentially coupled to the second light-emission control signal line patterns 903 in the display subpixels in the row in the second direction to form an integral structure.

Further, the first gate line pattern 802, the first light-emission control signal line pattern 803, the second gate line pattern 902 and the second light-emission control signal line pattern 903 may be arranged at a same layer and made of a same material. In this regard, all the first gate line patterns 802, the first light-emission control signal line patterns 803, the second gate line patterns 902 and the second light-emission control signal line patterns 903 in the display substrate may be formed simultaneously through a single patterning process, so as to simplify the manufacture process of the display substrate in a better manner, thereby to reduce the manufacture cost of the display substrate.

As shown in FIGS. 12, 13a, 14 and 15, in some embodiments of the present disclosure, the first potential signal line pattern may include a first power source signal line pattern 801. The virtual subpixel driving circuit may further include a first storage capacitor Cst', the gate electrode of the virtual driving transistor may be reused as a first electrode plate Cst1' of the first storage capacitor Cst', a second electrode plate Cst2' of the first storage capacitor Cst' may be located at a side of the first electrode plate Cst1' away from the base substrate, an orthogonal projection of the second electrode plate Cst2' onto the base substrate may overlap an orthogonal projection of a first portion 8011 of the first power source signal line pattern 801 extending in the first direction onto the base substrate at an overlapping region where the second electrode plate is coupled to the first portion 8011.

Each display subpixel 90 may further include a second power source signal line pattern 901 including a third portion extending in the first direction. The display subpixel driving circuit may further include a driving transistor and a second storage capacitor Cst, the gate electrode of the driving transistor may be reused as a third electrode plate Cst1 of the second storage capacitor Cst, a fourth electrode plate Cst2 of the second storage capacitor Cst may be located at a side of the third electrode plate Cst1 away from the base substrate, and an orthogonal projection of the fourth electrode plate Cst2 onto the base substrate may overlap an orthogonal projection of the third portion of the second power source signal line pattern 901 onto the base substrate at an overlapping region where the fourth electrode plate Cst2 is coupled to the third portion. The second electrode plate Cst2' in each of the virtual subpixels 80 arranged in a same row in the second direction may be formed integrally with the fourth electrode plate Cst2 in the corresponding display subpixel 90 in the row.

To be specific, the virtual subpixel driving circuit may further include the first storage capacitor, and the display subpixel driving circuit may further include the second storage capacitor. The second electrode plate of the first storage capacitor may be arranged at a same layer, and made of a same material, as the fourth electrode plate of the second storage capacitor. In this regard, the second electrode plates of all the first storage capacitors and the fourth electrode plates of all the second storage capacitors in the display substrate may be formed simultaneously through a single patterning process, so as to simplify the manufacture process of the display substrate in a better manner, thereby to reduce the manufacture cost of the display substrate.

When the second electrode plate of each of the virtual subpixels 80 in a same row is formed integrally with the fourth electrode plate of the corresponding display subpixel 90 in the row in the second direction, it is able to reduce a layout space occupied by the second electrode plate and the fourth electrode plate to the greatest extent, thereby to be adapted to a trend of a high-resolution display substrate.

As shown in FIGS. 12, 13a, 14 and 15, in some embodiments of the present disclosure, each display subpixel 90 may include a second power source signal line pattern 901 including a third portion extending in the first direction, and the first portion 8011 of the first power source signal line pattern 801 in each of the virtual subpixels 80 in a same column in the first direction may be formed integrally with the third portion of the second power source signal line pattern 901 in the corresponding display subpixel in the column.

Based on the above arrangement mode, it is able to minimize a layout space occupied by the first power source signal line pattern 801 and the second power source signal line pattern 901, thereby to be adapted to the trend of the high-resolution display substrate. In addition, all the first power source signal line patterns 801 in the virtual subpixels 80 and all the second power source signal line patterns 901 in the display subpixels 90 may be formed simultaneously through a single patterning process, so as to simplify the manufacture process of the display substrate in a better manner, thereby to reduce the manufacture cost of the display substrate.

As shown in FIGS. 12, 13a, 14 and 15, in some embodiments of the present disclosure, each virtual subpixel 80 may further include a first gate line pattern 802, a first light-emission control signal line pattern 803, a first initialization signal line pattern 804 and a first resetting signal line pattern 805 each extending in the second direction and sequentially arranged in the first direction.

Each display subpixel 90 may further include a second initialization signal line pattern 9041, a third initialization signal line pattern 9042, a second resetting signal line pattern 9051 and a third resetting signal line pattern 9052 each extending in the second direction. The first initialization signal line pattern 804 in each of the virtual subpixels 80 in a same row may be coupled to, and formed integrally with, the second initialization signal line pattern 9041 in the corresponding display subpixel 90 in the row in the second direction. The first resetting signal line pattern 805 in each of the virtual subpixels 80 in a same row may be coupled to, and formed integrally with, the second resetting signal line pattern 9051 in the corresponding display subpixel 90 in the row in the second direction.

To be specific, in one display subpixel 90, the second initialization signal line pattern 9041, the second resetting signal line pattern 9051, the third initialization signal line pattern 9042 and the third resetting signal line pattern 9052 may be arranged sequentially in the first direction.

When the first initialization signal line pattern 804 in each of the virtual subpixels 80 in a same row is coupled to, and formed integrally with, the second initialization signal line pattern 9041 in the corresponding display subpixel 90 in the row in the second direction, and the first resetting signal line pattern 805 in each of the virtual subpixels 80 in a same row is coupled to, and formed integrally with, the second resetting signal line pattern 9051 in the corresponding display subpixel 90 in the row in the second direction, it is able to not only effectively reduce a layout space occupied by the virtual subpixels 80 and the display subpixels 90, but also form the first initialization signal line pattern 804 and the second initialization signal line pattern 9041 simultaneously through a single patterning process and form the first resetting signal line pattern 805 and the second resetting signal line pattern 9051 simultaneously through a single patterning process.

It should be appreciated that, in the display subpixel 90, the second initialization signal line pattern 9041 may be arranged at a same layer, and made of a same material, as the third initialization signal line pattern 9042, so it is able to form them simultaneously through a single patterning process. The second resetting signal line 9051 may be arranged at a same layer, and made of a same material, as the third resetting signal line pattern 9052, so it is able to form them simultaneously through a single patterning process.

As shown in FIGS. 13a and 15, in some embodiments of the present disclosure, each virtual subpixel 80 may further include a first data line pattern 808 extending in the first direction, each display subpixel 90 may include a second data line pattern 908 extending in the first direction, and the first data line pattern 808 in each of the virtual subpixels 80 in a same column in the first direction may be formed integrally with the second data line pattern 908 in the corresponding display subpixel 90 in the column.

To be specific, when the first data line pattern 808 in each of the virtual subpixels 80 in a same column in the first direction is formed integrally with the second data line pattern 908 in the corresponding display subpixel 90 in the column, it is able to minimize a layout space occupied by the first data line pattern 808 and the second data line pattern 908, thereby to be adapted to the high-resolution display substrate. In addition, it is able to form all the first data line patterns 808 in the virtual subpixels 80 and all the second data line patterns 908 in the display subpixels 90 simultaneously through a single patterning process, so as to simplify the manufacture process of the display substrate in a better manner, thereby to reduce the manufacture cost of the display substrate.

Figure 8:
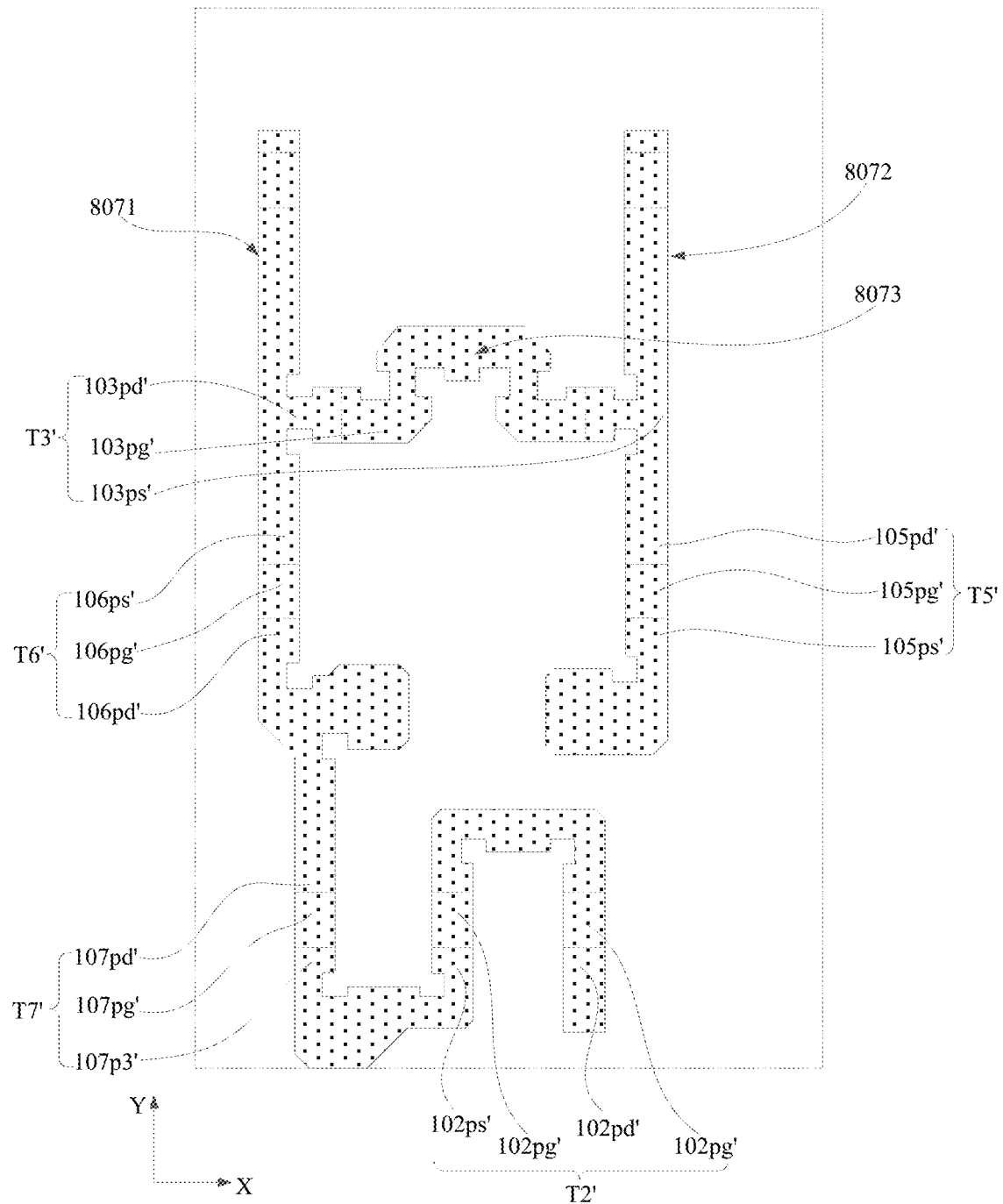
FIG. 8 is a schematic view showing layout of an active layer in FIG. 7.

As shown in FIG. 8, in some embodiments of the present disclosure, each virtual subpixel 80 may include an active layer pattern. The active layer pattern may include: a first active sub-pattern 8071 and a second active sub-pattern 8072 arranged opposite to each other and each extending in the first direction; and a third active sub-pattern 8073 arranged between the first active sub-pattern 8071 and the second active sub-pattern 8072. Two ends of the third active sub-pattern 8073 may be coupled to the first active sub-pattern 8071 and the second active sub-pattern 8072 respectively, and an orthogonal projection of at least a part of the third active sub-pattern 8073 onto the base substrate may overlap the orthogonal projection of the gate electrode of the virtual driving transistor onto the base substrate.

As shown in FIG. 7, an orthogonal projection of a portion of the first conductive connection member 8061 away from the gate electrode of the virtual driving transistor onto the base substrate may not overlap an orthogonal projection of the active layer pattern onto the base substrate.

To be specific, the active layer pattern in each virtual subpixel 80 may be of various structures. For example, the active layer pattern may include the first active sub-pattern 8071, the second active sub-pattern 8072 and the third active sub-pattern 8073. Through this arrangement mode, the orthogonal projection of the first conductive connection member 8061 onto the base substrate may be located between the orthogonal projection of the first active sub-pattern 8071 onto the base substrate and the orthogonal projection of the second active sub-pattern 8072 onto the base substrate, the orthogonal projection of one end of the first conductive connection member 8061 coupled to the virtual driving transistor onto the base substrate may overlap the orthogonal projection of the third active sub-pattern 8073 onto the base substrate, and the orthogonal projection of the portion of the first conductive connection member 8061 away from the gate electrode of the virtual driving transistor onto the base substrate may not overlap the orthogonal projection of the active layer pattern onto the base substrate.

Through the above arrangement mode, it is able to simplify the structure of the active layer pattern in each virtual subpixel 80 and effectively reduce a layout space occupied by the active layer pattern, thereby to reduce the difficulty in the layout of the virtual subpixel 80 at the peripheral region in a better manner.

As shown in FIGS. 7 and 8, in some embodiments of the present disclosure, each virtual subpixel 80 may further include a first data line pattern 808 extending in the first direction, an orthogonal projection of the second active sub-pattern 8072 onto the base substrate may be located between an orthogonal projection of the first data line pattern 808 onto the base substrate and the orthogonal projection of the first active sub-pattern 8071 onto the base substrate, and the orthogonal projection of the first data line pattern 808 onto the base substrate may not overlap the orthogonal projection of the active layer pattern onto the base substrate.

To be specific, in each virtual subpixel 80, the orthogonal projection of the portion of the first power source signal line pattern 801 extending in the first direction onto the base substrate may cover at least a part of the orthogonal projection of the second active sub-pattern 8072 onto the base substrate, and the first data line patterns 808 and the first power source signal line patterns 801 may be arranged alternately. The orthogonal projection of the first data line pattern 808 onto the base substrate may not overlap the orthogonal projection of the active layer pattern onto the base substrate, so no data signal may be provided by the first data line pattern 808 to the virtual subpixel driving circuit.

The virtual subpixel driving circuit in each virtual subpixel 80 is not a complete circuit, i.e., it is impossible for the virtual subpixel driving circuit to achieve a normal driving function. Through the above arrangement mode, the first data line pattern 808 may not provide the data signal to the virtual subpixel 80, so it is able to prevent the virtual subpixel driving circuit from operating abnormally upon the receipt of the data signal, thereby to prevent the operating stability of the display substrate from being adversely affected.

Figure 14:
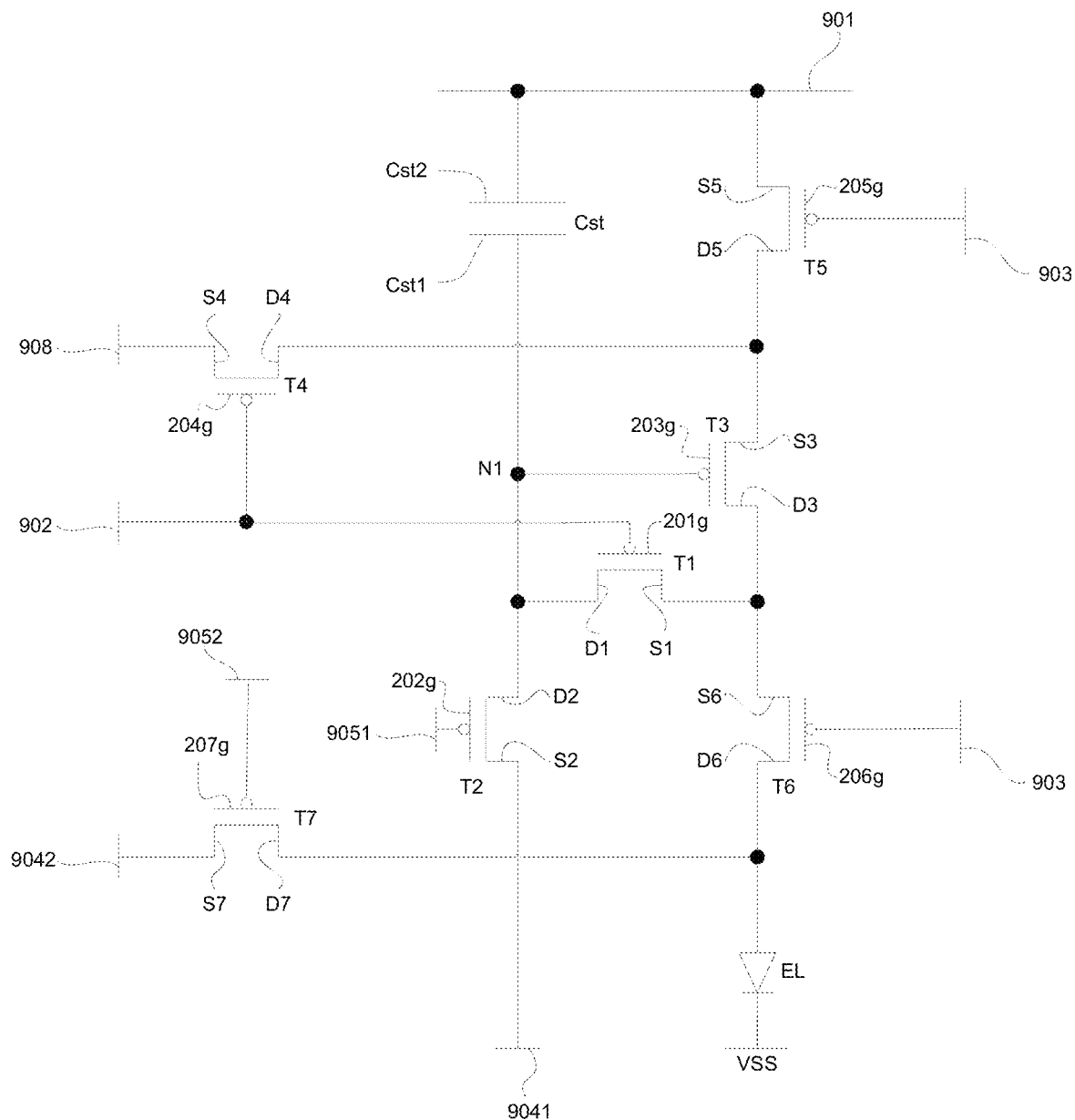
FIG. 14 is a schematic view showing a structure of a display subpixel driving circuit according to one embodiment of the present disclosure.

As shown in FIGS. 14 and 15, in some embodiments of the present disclosure, the display subpixel driving circuit may further include a third conductive connection member 8063 extending in the first direction. A first end of the third conductive connection member 8063 may be coupled to the gate electrode of the driving transistor (i.e., the gate electrode 203g of the third transistor T3), and a second end of the third conductive connection member 8063 may be coupled to the second electrode of the first transistor T1 and the second electrode of the second transistor T2.

As shown in FIGS. 14 and 15, in some embodiments of the present disclosure, the second electrode of the first transistor T1 may be coupled to the second electrode of the second transistor T2 to form a common connection end (in proximity to the node N1 in FIG. 15). An orthogonal projection of the second end of the third conductive connection member 8063 onto the base substrate may overlap an orthogonal projection of the common connection end onto the base substrate at an overlapping region where the second end of the third conductive connection member 8063 is coupled to the common connection end.

As shown in FIGS. 14 and 15, in some embodiments of the present disclosure, each display subpixel 90 may include a second power source signal line pattern 901, a second data line pattern 908, a second gate line pattern 902, a second light-emission control signal line pattern 903, a second resetting signal line pattern 9051, a third resetting signal line pattern 9052, a second initialization signal line pattern 9041 and a third initialization signal line pattern 9042. At least a part of the second power source signal line pattern 901 and the second data line pattern 908 may extend in a first direction, and the second gate line pattern 902, the second light-emission control signal line pattern 903, the second resetting signal line pattern 9051, the third resetting signal line pattern 9052, the second initialization signal line pattern 9041 and the third initialization signal line pattern 9042 may extend in a second direction intersecting the first direction.

The display subpixel 90 may further include a display subpixel driving circuit, which includes a driving transistor, a first transistor, a second transistor, a fourth transistor, a fifth transistor, a sixth transistor and a seventh transistor. A gate electrode of the driving transistor may be coupled to a second electrode of the first transistor, a first electrode of the driving transistor may be coupled to a second electrode of the fifth transistor, and a second electrode of the driving transistor may be coupled to a first electrode of the first transistor. A gate electrode of the first transistor may be coupled to the second gate line pattern 902. A gate electrode of the second transistor may be coupled to the second resetting signal line pattern 9051, a first electrode of the second transistor may be coupled to the second initialization signal line pattern 9041, and a second electrode of the fourth transistor may be coupled to the gate electrode of the driving transistor. A gate electrode of the fourth transistor may be coupled to the second gate line pattern 902, a first electrode of the fourth transistor may be coupled to the second data line pattern 908, and a second electrode of the fourth transistor may be coupled to the first electrode of the driving transistor. A gate electrode of the fifth transistor may be coupled to the second light-emission control signal line pattern 903, and a first electrode of the fifth transistor may be coupled to the second power source signal line pattern 901. A gate electrode of the sixth transistor may be coupled to the second light-emission control signal line pattern 903, a first electrode of the sixth transistor may be coupled to the second electrode of the driving transistor, and a second electrode of the sixth transistor may be coupled to a light-emission element in the display subpixel 90. A second electrode of the seventh transistor may be coupled to the light-emitting element in the display subpixel 90, a gate electrode of the seventh transistor may be coupled to the third resetting signal line pattern 9052, and a first electrode of the seventh transistor may be coupled to the third initialization signal line pattern 9042.

To be specific, as shown in FIGS. 14 and 15, taking one display subpixel driving circuit as an example, the transistors in the display subpixel driving transistors may all be P-type transistors. The first transistor T1 may be of a double-gate structure, a gate electrode 201g of the first transistor T1 may be coupled to the second gate line pattern 902, a source electrode S1 of the first transistor T1 may be coupled to a drain electrode D3 of the third transistor T3 (i.e., the driving transistor), and a drain electrode D1 of the first transistor T1 may be coupled to a gate electrode 203g of the third transistor T3.

The second transistor T2 may be of a double-gate structure, a gate electrode 202g of the second transistor T2 may be coupled to the second resetting signal line pattern 9051, a source electrode S2 of the second transistor T2 may be coupled to the second initialization signal line pattern 9041, and a drain electrode D2 of the second transistor T2 may be coupled to the gate electrode 203g of the third transistor T3.

A gate electrode 204g of the fourth transistor T4 may be coupled to the second gate line pattern 902, a source electrode S4 of the fourth transistor T4 may be coupled to the second data line pattern 908, and a drain electrode D4 of the fourth transistor T4 may be coupled to a source electrode S3 of the third transistor T3.

A gate electrode 205g of the fifth transistor T5 may be coupled to the second light-emission control signal line pattern 903, a source electrode S5 of the fifth transistor T5 may be coupled to the second power source signal line pattern 901, and a drain electrode D5 of the fifth transistor T5 may be coupled to the source electrode S3 of the third transistor T3.

A gate electrode 206g of the sixth transistor T6 may be coupled to the second light-emission control signal line pattern 903, a source electrode S6 of the sixth transistor T6 may be coupled to the drain electrode D3 of the third transistor T3, and a drain electrode D6 of the sixth transistor T6 may be coupled to an anode of a light-emitting element EL.

A gate electrode 207g of the seventh transistor T7 may be coupled to the third resetting signal line pattern 9052, a drain electrode D7 of the seventh transistor T7 may be coupled to the anode of the light-emitting element EL, and a source electrode S7 of the seventh transistor T7 may be coupled to the third initialization signal line pattern 9042.

The third electrode plate Cst1 of the second storage capacitor Cst may be reused as the gate electrode 203g of the third transistor T3, and the fourth electrode plate Cst2 of the second storage capacitor Cst may be coupled to the second power source signal line pattern 901.

During the operation of the display subpixel driving circuit with the above-mentioned structure, each operating period may include a first resetting phase P1, a write-in compensation phase P2, a second resetting phase P3 and a light-emitting phase P4.

Within the first resetting phase P1, a second resetting signal inputted to the second resetting signal line pattern 9051 may be at a valid level, so as to turn on the second transistor T2 and input an initialization signal from the second initialization signal line pattern 9041 to the gate electrode 203g of the third transistor T3, thereby to enable a gate-to-source voltage Vgs maintained within a previous frame on the third transistor T3 to be zero, and reset the gate electrode 203g of the third transistor T3.

Within the write-in compensation phase P2, the second resetting signal may be at an invalid level, so as to turn off the second transistor T2. A gate scanning signal inputted to the second gate line pattern 902 may be at a valid level, so as to turn on the first transistor T1 and the fourth transistor T4. A data signal may be written into the second data line pattern 908, and transmitted to the source electrode S3 of the third transistor T3 via the fourth transistor T4. At the same time, the first transistor T1 and the fourth transistor T4 may be turned on, so that the third transistor T3 forms a diode structure. Hence, through the cooperation of the first transistor T1, the third transistor T3 and the fourth transistor T4, it is able to compensate for a threshold voltage of the third transistor T3. When a compensation time is long enough, a potential at the gate electrode 203g of the third transistor T3 may reach Vdata+Vth, where Vdata represents a voltage value of the data signal, and Vth represents the threshold voltage of the third transistor T3.

Within the second resetting phase P3, the gate scanning signal may be at an invalid level, so as to turn off the first transistor T1 and the fourth transistor T4. A third resetting signal inputted to the third resetting signal line pattern 9052 may be at a valid level, so as to turn on the seventh transistor T7. An initialization signal from the third initialization signal line pattern 9042 may be inputted to the anode of the light-emitting element EL, so as to control the light-emitting element EL not to emit light.

Within the light-emitting phase P4, a light-emission control signal written into the second light-emission control signal line pattern 903 may be at a valid level, so as to turn on the fifth transistor T5 and the sixth transistor T6, thereby to input a power source signal from the second power source signal line pattern 901 to the source electrode S3 of the third transistor T3. At the same time, the gate electrode 203g of the third transistor T3 is maintained at Vdata+Vth, so that the third transistor T3 may be turned on and a gate-to-source voltage of the third transistor T3 may be Vdata+Vth−VDD, where VDD represents a voltage value of the power source signal. A leakage current generated on the basis of the gate-to-source voltage may flow to the anode of the corresponding light-emitting element EL, so as to drive the corresponding light-emitting element EL to emit light.

As shown in FIGS. 13a, 13c and 16-19, during the manufacture of the display subpixel driving circuit, the layout of film layers for the display subpixel driving circuit will be described as follows. An active film layer, a first gate insulation layer GI1, a first gate metal layer, a second gate insulation layer GI2, a second gate metal layer, an interlayer insulation layer ILD and a first source-drain metal layer may be sequentially laminated one on another in a direction away from the base substrate 40. In addition, such film layers as an inorganic insulation layer, a planarization layer and the anode may be arranged on the source-drain metal layer.

It should be appreciated that, in the embodiments of the present disclosure, the inorganic layer may be made of an inorganic material such as silicon nitride or silicon oxide, and the organic layers, e.g., the planarization layer and a pixel definition layer, may be made of an organic material such as polyimide, which will not be particularly defined herein.

Figure 16:
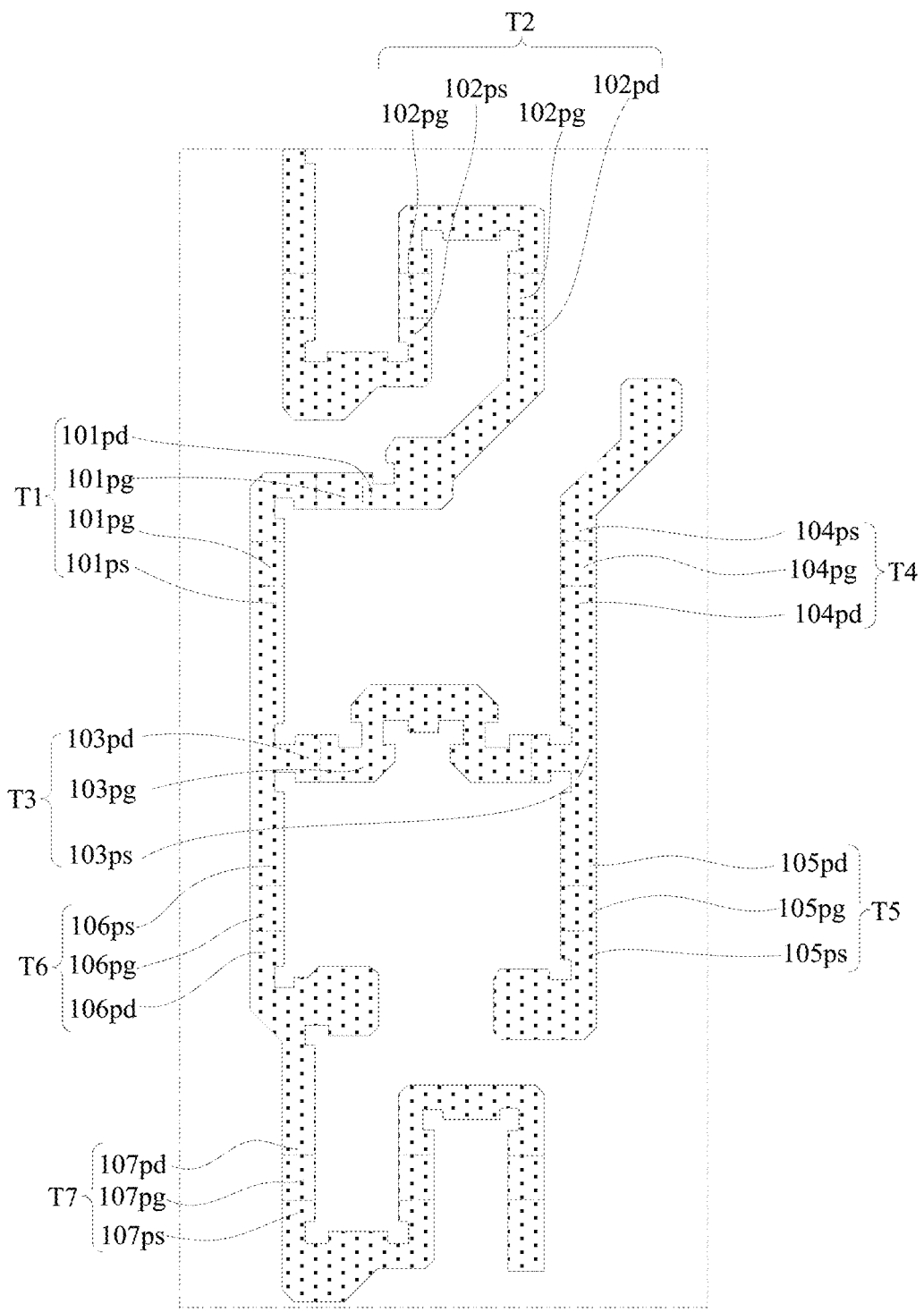
FIG. 16 is a schematic view showing layout of an active layer in FIG. 15.

As shown in FIG. 16, the active film layer may be used to form a channel region (e.g., 101pg to 107pg), a source electrode formation region (e.g., 101ps to 107ps) and a drain electrode formation region (e.g., 101pd to 107pd) of each transistor in the display subpixel driving circuit. Due to a doping effect, the active film layer corresponding to the source electrode formation region and the drain electrode formation region may have conductivity superior to the active film layer corresponding to the channel region. The active film layer may be made of amorphous silicon, poly-silicon or an oxide semiconductor material. It should be appreciated that, the source electrode formation region and the drain electrode formation region may each be a region doped with n-type or p-type impurities.

In addition, it should be appreciated that, the active film layers corresponding to the source electrode formation region and the drain electrode formation region may directly serve as the source electrode and the drain electrode respectively; or the source electrode in contact with the source electrode formation region may be made of a metal material, and the drain electrode in contact with the drain electrode formation region may be made of a metal material.

Figure 17:
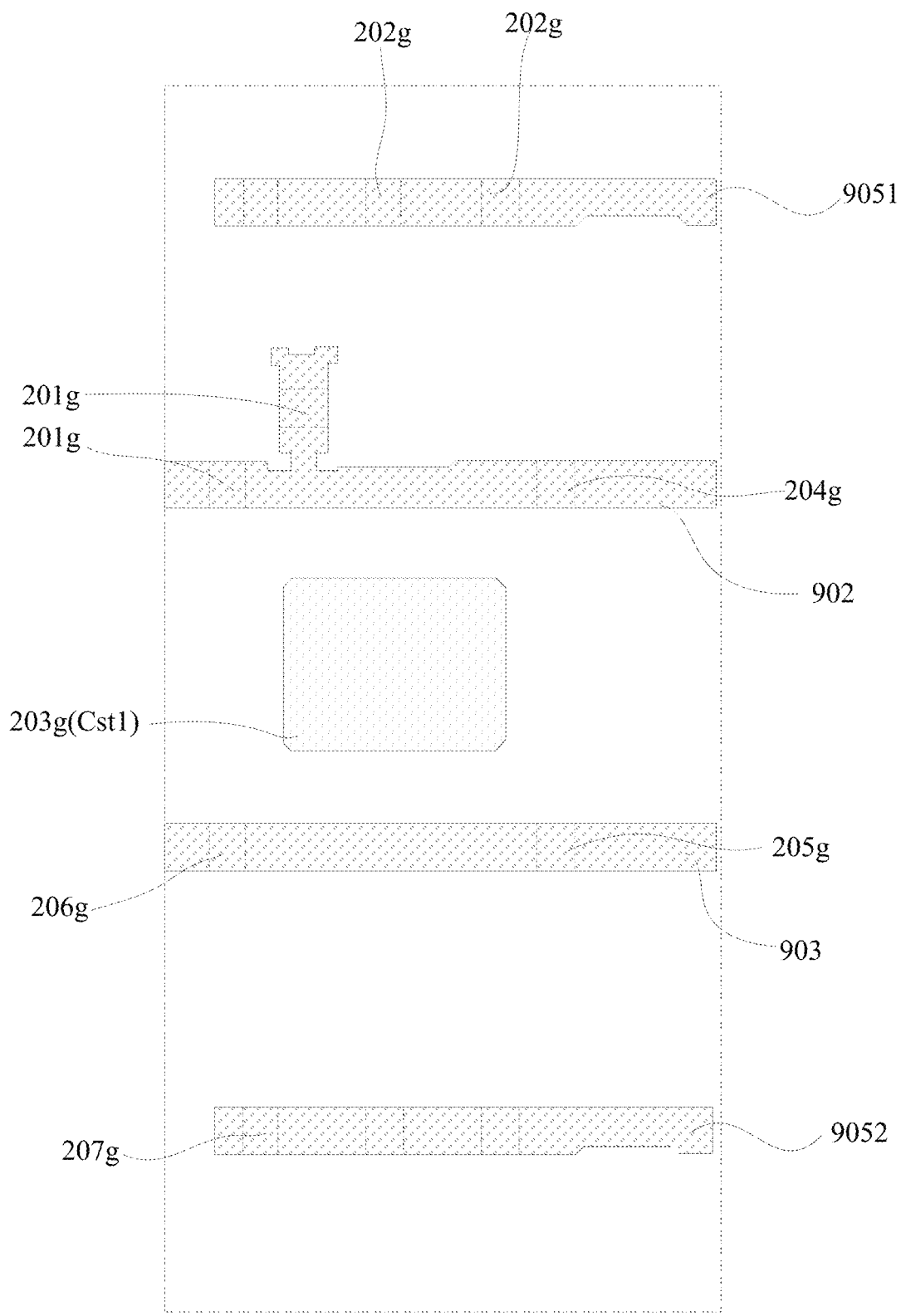
FIG. 17 is a schematic view showing layout of a first gate metal layer in FIG. 15.

As shown in FIG. 17, the first gate metal layer may be used to form the gate electrodes (e.g., 201g to 207g) of the transistors in the display subpixel driving circuit, as well as the second gate line pattern 902, the second light-emission control signal line pattern 903, the second resetting signal line pattern 9051 and the third resetting signal line pattern 9052 of the display substrate. The gate electrode 203g of the third transistor T3 in each display subpixel driving circuit may be reused as the third electrode plate Cst1 of the second storage capacitor Cst in the display subpixel driving circuit.

Figure 18:
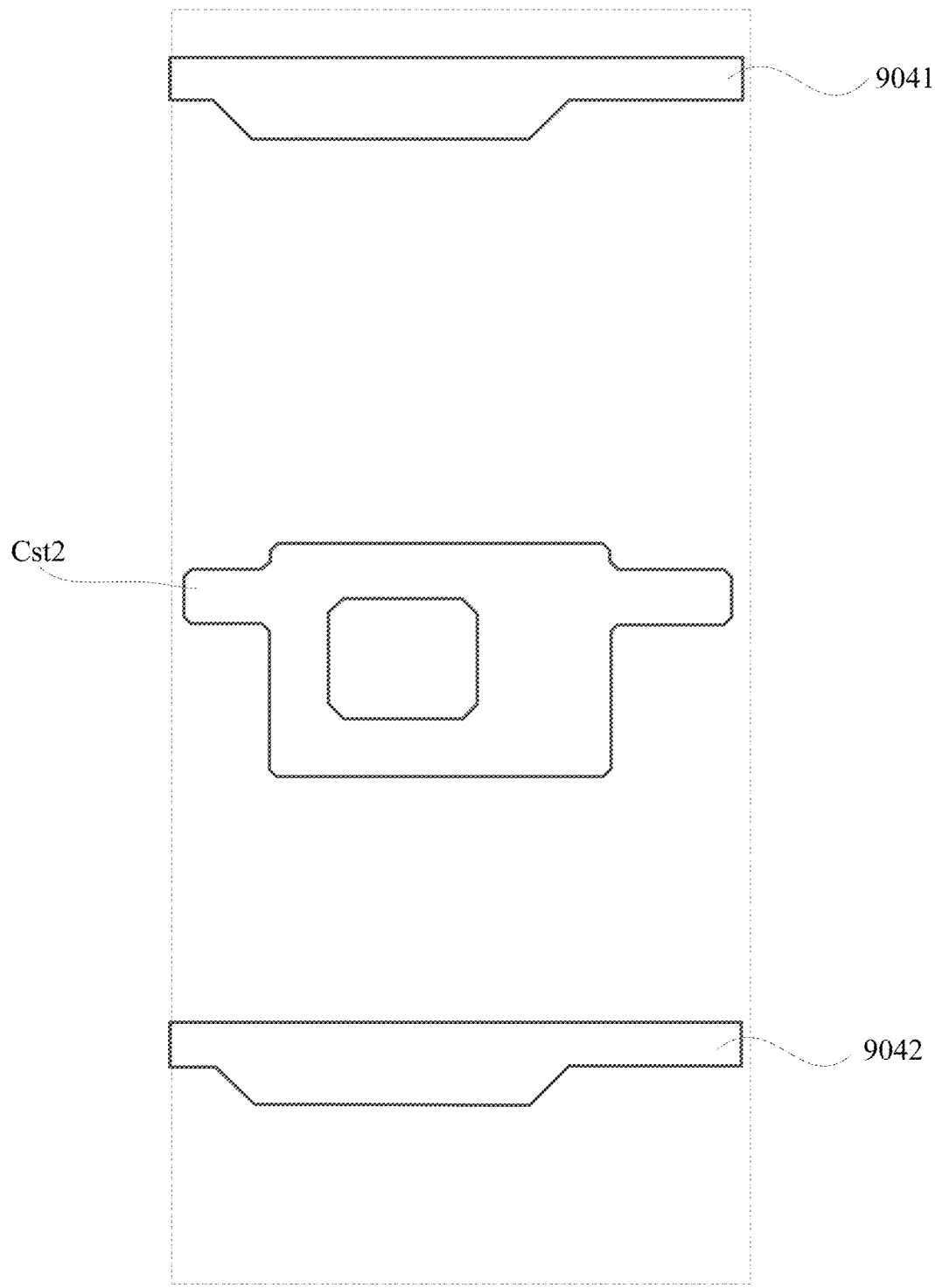
FIG. 18 is a schematic view showing layout of a second gate metal layer in FIG. 15.

As shown in FIG. 18, the second gate metal layer may be used to form the fourth electrode plate Cst2 of the second storage capacitor Cst, as well as the second initialization signal line pattern 9041 and the third initialization signal line pattern 9042 of the display substrate.

Figure 19:
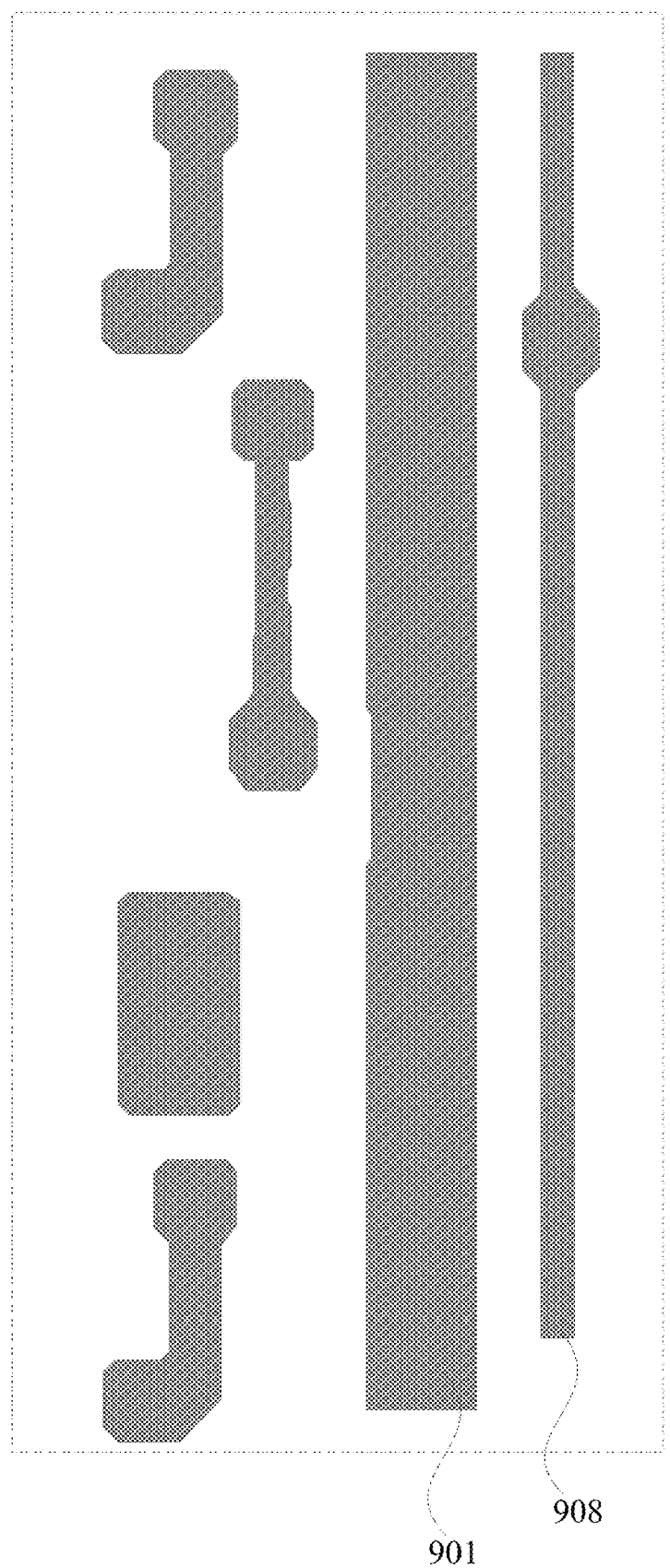
FIG. 19 is a schematic view showing layout of a source-drain metal layer in FIG. 15.

As shown in FIGS. 14, 15 and 19, the first source-drain metal layer may be used to form the source electrodes (e.g., S1 to S7) and the drain electrodes (e.g., D1 to D7) of the transistors in the display subpixel driving circuit, as well as the second data line pattern 908, the second power source signal line pattern 901 and some conductive connection members of the display substrate.

More specifically, referring to FIGS. 14 to 17 again, the gate electrode 201g of the first transistor T1 may cover a first channel region 101pg, the source electrode S1 of the first transistor T1 may be located at a first source electrode formation region 101ps, and the drain electrode D1 of the first transistor T1 may be located at a first drain electrode formation region 101pd.

The gate electrode 202g of the second transistor T2 may cover a second channel region 102pg, the source electrode S2 of the second transistor T2 may be located at a second source electrode formation region 102ps, and the drain electrode D2 of the second transistor T2 may be located at a second drain electrode formation region 102pd.

The gate electrode 203g of the third transistor T3 may cover a third channel region 103pg, the source electrode S3 of the third transistor T3 may be located at a third source electrode formation region 103ps, and the drain electrode D3 of the third transistor T3 may be located at a third drain electrode formation region 103pd.

The gate electrode 204g of the fourth transistor T4 may cover a fourth channel region 104pg, the source electrode S4 of the fourth transistor T4 may be located at a fourth source electrode formation region 104ps, and the drain electrode D4 of the fourth transistor T4 may be located at a fourth drain electrode formation region 104pd.

The gate electrode 205g of the fifth transistor T5 may cover a fifth channel region 105pg, the source electrode S5 of the fifth transistor T5 may be located at a fifth source electrode formation region 105ps, and the drain electrode D5 of the fifth transistor T5 may be located at a fifth drain electrode formation region 105pd.

The gate electrode 206g of the sixth transistor T6 may cover a sixth channel region 106pg, the source electrode S6 of the sixth transistor T6 may be located at a sixth source electrode formation region 106ps, and the drain electrode D6 of the sixth transistor T6 may be located at a sixth drain electrode formation region 106pd.

The gate electrode 207g of the seventh transistor T7 may cover a seventh channel region 106pg, the source electrode S7 of the seventh transistor T7 may be located at a seventh source electrode formation region 107ps, and the drain electrode D7 of the seventh transistor T7 may be located at a seventh drain electrode formation region 107pd.

The gate electrode 203g of the third transistor T3 may be reused as the first electrode plate Cst1 of the storage capacitor Cst, and the second electrode plate Cst2 of the storage capacitor Cst may be coupled to the power source signal line pattern VDD.

In addition, in the display substrate according to the embodiments of the present disclosure, the plurality of display subpixels 90 may be arranged in an array form, i.e., in a plurality of rows and columns. Each row of display subpixels 90 may include a plurality of display subpixels 90 arranged in the second direction, and each column of display subpixels 90 may include a plurality of display subpixels 90 arranged in the first direction intersecting the second direction.

In order to simplify the layout space for the subpixels, the third resetting signal line pattern 9052 of each display subpixel 90 in one row may be reused as the second resetting signal line pattern 9051 of an adjacent display subpixel 90 in a next row. Identically, the third initialization signal line pattern 9042 of each display subpixel 90 in one row may be reused as the second initialization signal line pattern 9041 of the adjacent display subpixel 90 in a next row.

As shown in FIG. 15, in some embodiments of the present disclosure, taking the subpixel driving circuit in one display subpixel 90 as an example, in the first direction (e.g., the direction Y), the gate electrode 204g of the fourth transistor T4, the gate electrode 201g of the first transistor T1 and the gate electrode 202g of the second transistor T2 may be located at a first side of the gate electrode of the driving transistor (i.e., the gate electrode 203g of the third transistor T3), and the gate electrode of the seventh transistor T7, the gate electrode 206g of the sixth transistor and the gate electrode of the fifth transistor T5 may be located at a second side of the gate electrode of the driving transistor. For example, the first side and the second side of the gate electrode of the driving transistor may be two opposite sides in the first direction. Further, the first side of the gate electrode of the driving transistor may be an upper side of the gate electrode of the driving transistor, and the second side of the gate electrode of the driving transistor may be a lower side of the gate electrode of the driving transistor T3. For example, a side of the display substrate for bonding an Integrated Circuit (IC) may be the lower side of the display substrate, and a side of the gate electrode of the driving transistor closer to the IC may be the lower side. The upper side may be a side opposite to the lower side, e.g., a side of the gate electrode of the driving transistor further away from the IC.

In some embodiments of the present disclosure, as shown in FIG. 15, in the second direction (e.g., the direction X), the gate electrode 204g of the fourth transistor T4 and the gate electrode 205g of the fifth transistor T5 may be located at a third side of the gate electrode of the driving transistor, and the gate electrode 201g of the first transistor T1 and the gate electrode 206g of the sixth transistor T6 may be located at a fourth side of the gate electrode of the driving transistor. For example, the third side and the fourth side of the gate electrode of the driving transistor may be two opposite sides in the second direction. Further, the third side of the gate electrode of the driving transistor may be a right side of the gate electrode of the driving transistor, and the fourth side of the gate electrode of the driving transistor may be a left side of the gate electrode of the driving transistor. For example, in a same subpixel, the second data line pattern 908 may be located at the right side of the second power source signal line pattern 901, and the second power source signal line pattern 901 may be located at a right side of the second data line pattern 908.

Figure 6:
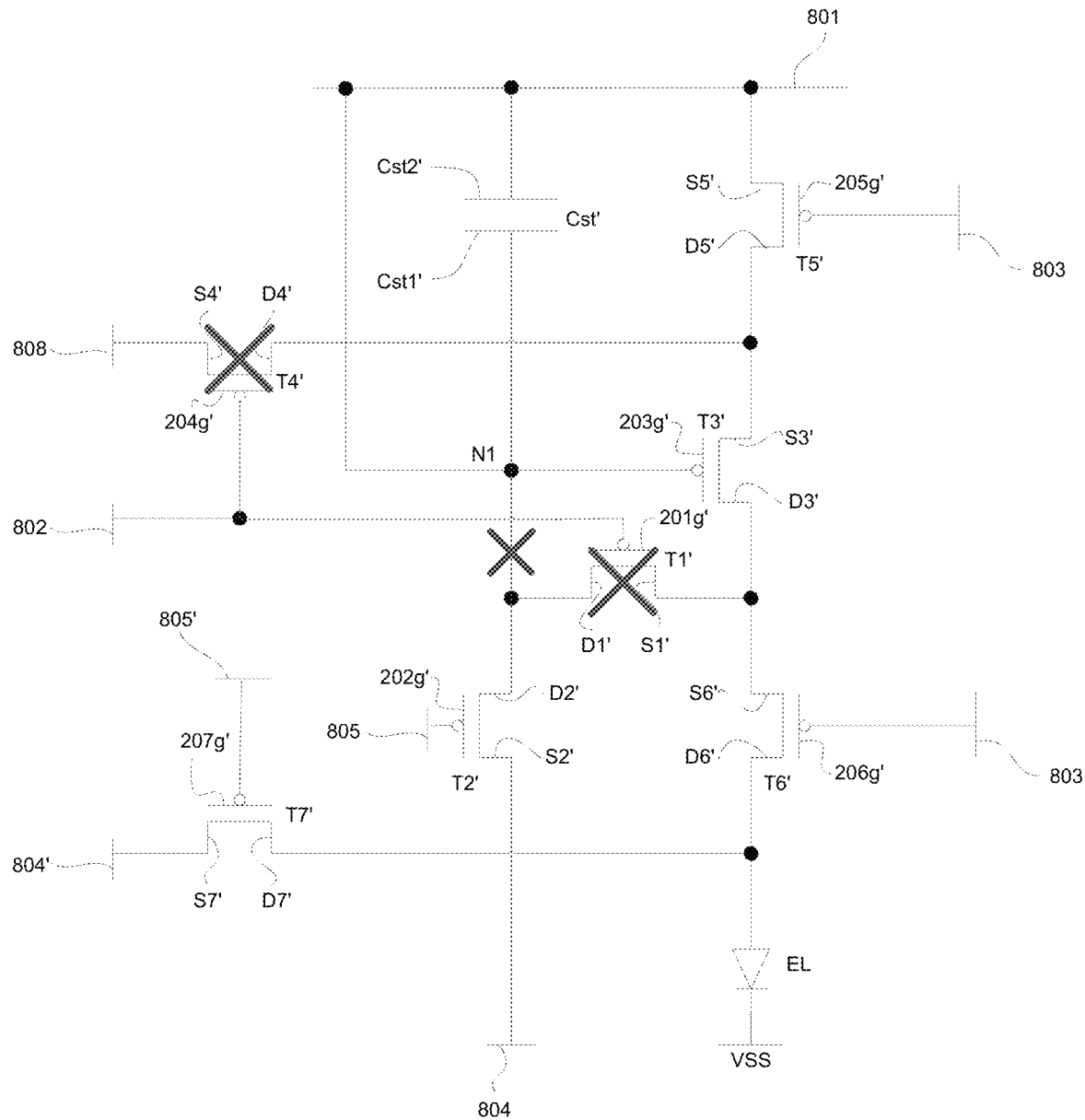
FIG. 6 is another schematic view showing the structure of the virtual subpixel driving circuit according to one embodiment of the present disclosure.

As shown in FIGS. 6 and 7, in some embodiments of the present disclosure, the first potential signal line pattern may include a first power source signal line pattern 901. Each virtual subpixel 90 may further include a first data line pattern 808, a first gate line pattern 802, a first light-emission signal line pattern 803, a first resetting signal line pattern 805 and a first initialization signal line pattern 804. At least a part of the first power source signal line pattern 801 and the first data line pattern 808 may each extend in the first direction, and the first gate line pattern 802, the first light-emission control signal line pattern 803, the first resetting signal line pattern 805 and the first initialization signal line pattern 804 may each extend in the second direction.

The virtual subpixel driving circuit may further include a second virtual transistor, a fifth virtual transistor and a sixth virtual transistor. A gate electrode of the virtual driving transistor may be coupled to the first power source signal line pattern 801, a first electrode of the virtual driving transistor may be coupled to a second electrode of the fifth virtual transistor, and a second electrode of the virtual driving transistor may be coupled to a first electrode of the sixth virtual transistor. A gate electrode of the second virtual transistor may be coupled to the first resetting signal line pattern 805, a first electrode of the second virtual transistor may be coupled to the first initialization signal line pattern 804, and a second electrode of the second virtual transistor may be in a floating state. A gate electrode of the fifth virtual transistor may be coupled to the first light-emission control signal line pattern 803, and a first electrode of the fifth virtual transistor may be coupled to the first power source signal line pattern 801. A gate electrode of the sixth virtual transistor may be coupled to the first light-emission control signal line pattern 803.

To be specific, taking one virtual subpixel driving circuit as an example, the virtual transistors of the virtual subpixel driving circuit may be P-type transistors. The second virtual transistor T2' may be of a double-gate structure, the gate electrode 202g' of the second virtual transistor T2' may be coupled to the first resetting signal line pattern 805, the source electrode S2' of the second virtual transistor T2' may be coupled to the first initialization signal line pattern 804, and the drain electrode D2' of the second virtual transistor T2' may be in a floating state.

The gate electrode 205g' of the fifth virtual transistor T5' may be coupled to the first light-emission control signal line pattern 803, the source electrode S5' of the fifth virtual transistor T5' may be coupled to the first power source signal line pattern 801, and the drain electrode D5' of the fifth virtual transistor T5' may be coupled to the source electrode S3' of the third virtual transistor T3'.

The gate electrode 206g' of the sixth virtual transistor T6' may be coupled to the first light-emission control signal line pattern 803.

Further, the source electrode S6' of the sixth virtual transistor T6' may be coupled to the drain electrode D3' of the third virtual transistor T3', and the drain electrode D6' of the sixth virtual transistor T6' may be coupled to the anode of the light-emitting element EL.

For example, the virtual subpixel driving circuit may further include a seventh virtual transistor T7', a gate electrode 207g' of which is coupled to the first resetting signal line pattern 805' in a next adjacent virtual subpixel 80 in the first direction, a drain electrode D7' of which is coupled to the anode of the light-emitting element EL, and a source electrode S7' of which is coupled to the first initialization signal line pattern 804'.

The first electrode plate Cst1 ' of the first storage capacitor Cst' may be reused as the gate electrode 203g' of the third virtual transistor T3', and the second electrode plate Cst2' of the first storage capacitor Cst' may be coupled to the first power source signal line pattern 801.

In a normal display subpixel 90, the node N1 may be coupled to the active pattern (a Poly pattern) corresponding to the drain electrode D1 of the first transistor T1 through a via-hole. A data signal may be written into the node N1 sequentially through the fourth transistor T4, the third transistor T3 and the first transistor T1. Within the light-emitting phase for the display subpixel 90, the leakage current may reach the light-emitting element EL sequentially through the fifth transistor T5, the third transistor T3 and the sixth transistor T6, so as to enable the light-emitting element EL to emit light.

In the virtual subpixel 80, no normal first virtual transistor T1' has been formed, so the node N1 in the virtual subpixel 80 cannot receive the data signal normally, and thereby the virtual subpixel driving circuit corresponding to the virtual subpixel 80 may not achieve a normal driving function. In the embodiments of the present disclosure, the node N1 may be coupled to the corresponding first power source signal line pattern 801 through the second conductive connection member 8062, so it is able to prevent the power source signal in the display substrate from being adversely affected due to the floating state of the node N1, thereby to effectively improve the stability of the power source signal in the display substrate and ensure the excellent operating performance of the display subpixel driving circuit.

It should be appreciated that, the specific structure of the virtual subpixel driving circuit may be determined according to the practical layout. For example, no virtual transistor may be lacking for the virtual subpixel driving circuit, or the lacked transistors may not be limited to the first virtual transistor T1' and the fourth virtual transistor T4' in FIG. 6.

In addition, as required by the actual layout, the virtual subpixel driving circuits at different positions may have different structures. For example, some virtual subpixel driving circuits may include all the transistors (e.g., include the first virtual transistor T1' to the seventh virtual transistor T7'), while some other virtual subpixel driving circuits may include a part of the virtual transistors.

Figure 13B:
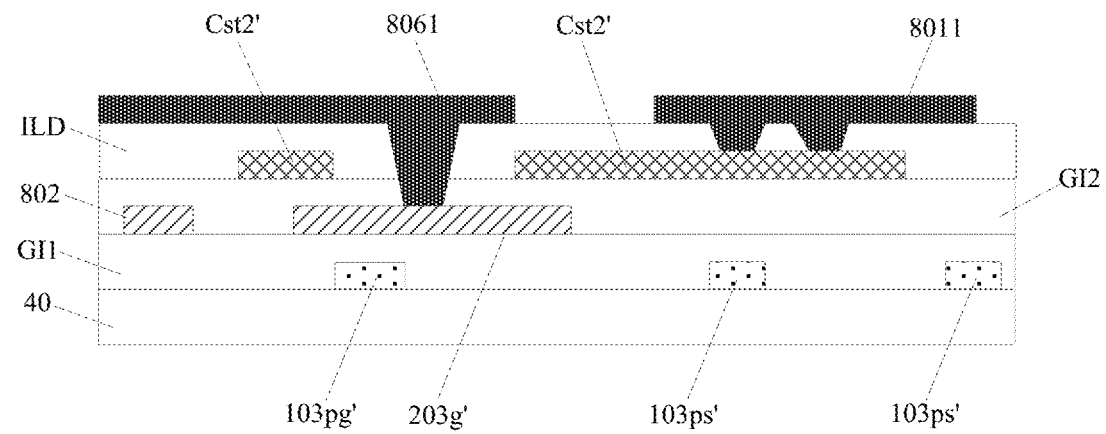
FIG. 13b is a sectional view of B in FIG. 13a along a line A1-A2.
Figure 13C:
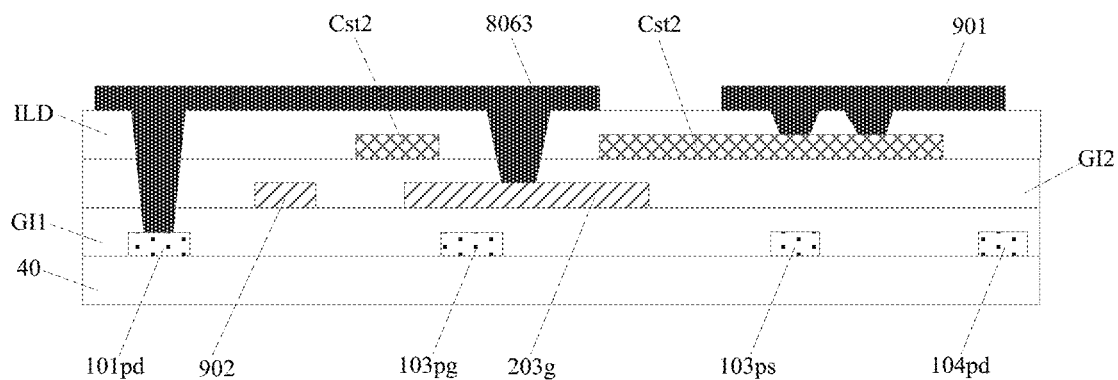
FIG. 13c is a sectional view of B in FIG. 13a along a line B1-B2.
Figure 13D:
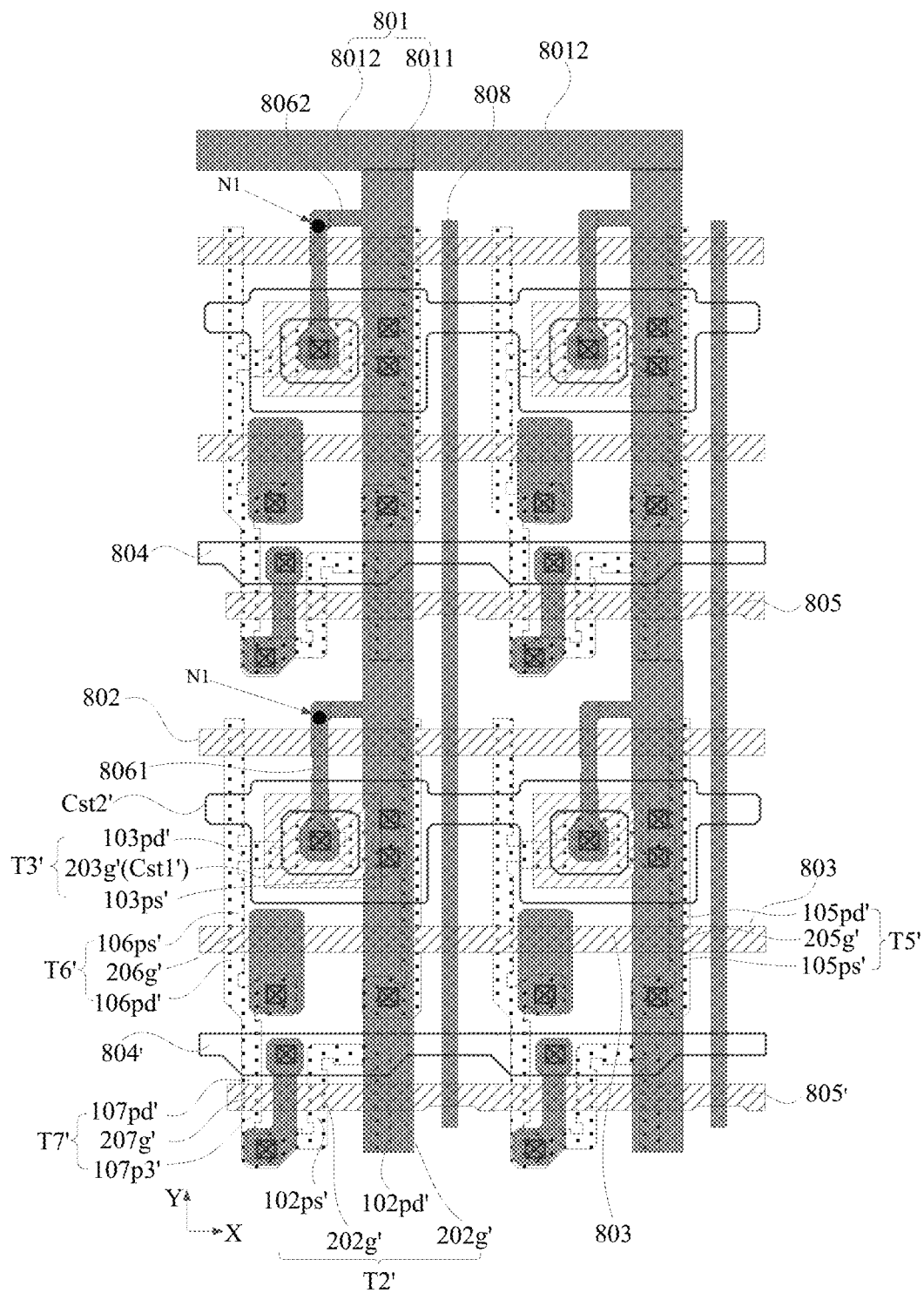
FIG. 13d is an enlarged view of C in FIG. 2.

As shown in FIGS. 7, 13a and 13b, during the manufacture of the virtual subpixel driving circuit, the layout of the film layers corresponding to the virtual subpixel driving circuit will be described as follows. An active film layer, a first gate insulation layer GI1, a first gate metal layer, a second gate insulation layer GI2, a second gate metal layer, an interlayer insulation layer ILD and a first source-drain metal layer may be sequentially laminated one on another in a direction away from the base substrate 40.

As shown in FIG. 8, the active film layer may be used to form channel regions (e.g., 101*pg* to 107*pg*), source electrode formation regions (e.g., 101*ps* to 107*ps*) and drain electrode formation regions (e.g., 101*pd* to 107*pd*) of the transistors in the virtual subpixel driving circuit. Due to a doping effect, the active film layers corresponding to the source electrode formation region and the drain electrode formation region may have conductivity superior to the active film layer corresponding to the channel region. The active film layer may be made of amorphous silicon, polysilicon or an oxide semiconductor material. It should be appreciated that, the source electrode formation region and the drain electrode formation region may each be a region doped with n-type or p-type impurities.

In addition, it should be appreciated that, the active film layers corresponding to the source electrode formation region and the drain electrode formation region may directly serve as the source electrode and the drain electrode respectively; or the source electrode in contact with the source electrode formation region may be made of a metal material, and the drain electrode in contact with the drain electrode formation region may be made of a metal material.

Figure 9:
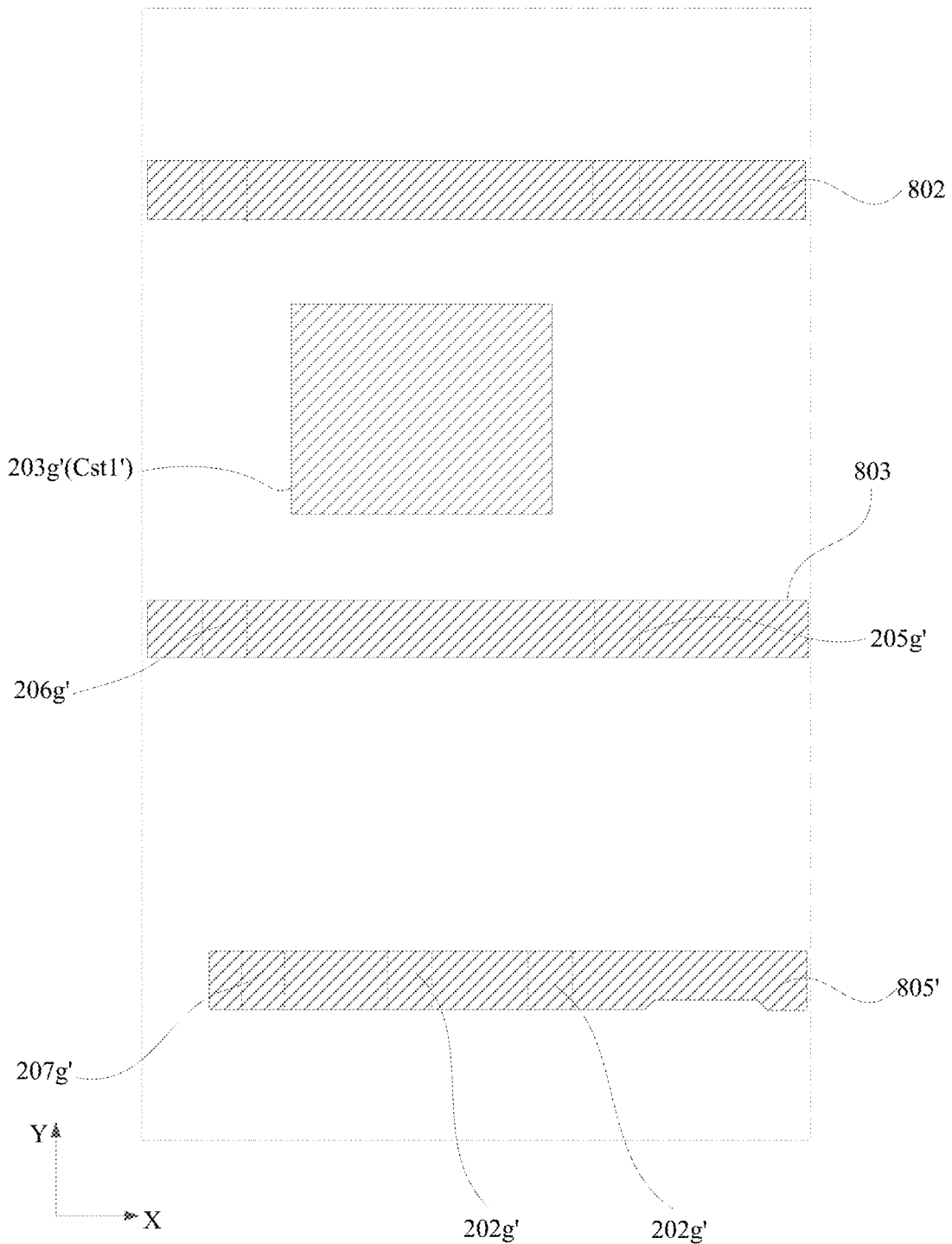
FIG. 9 is a schematic view showing layout of a first gate metal layer in FIG. 7.

As shown in FIG. 9, the first gate metal layer may be used to form the gate electrodes (e.g., 202*g*' to 207*g*') of the transistors in the virtual subpixel driving circuit, as well as the first gate line pattern 802, the first light-emission control signal line pattern 803, and the first resetting signal line pattern 805 of the display substrate. The gate electrode 203*g*' of the third virtual transistor T3' in each virtual subpixel driving circuit may be reused as the first electrode plate Cst1 ' of the first storage capacitor Cst' in the virtual subpixel driving circuit.

Figure 10:
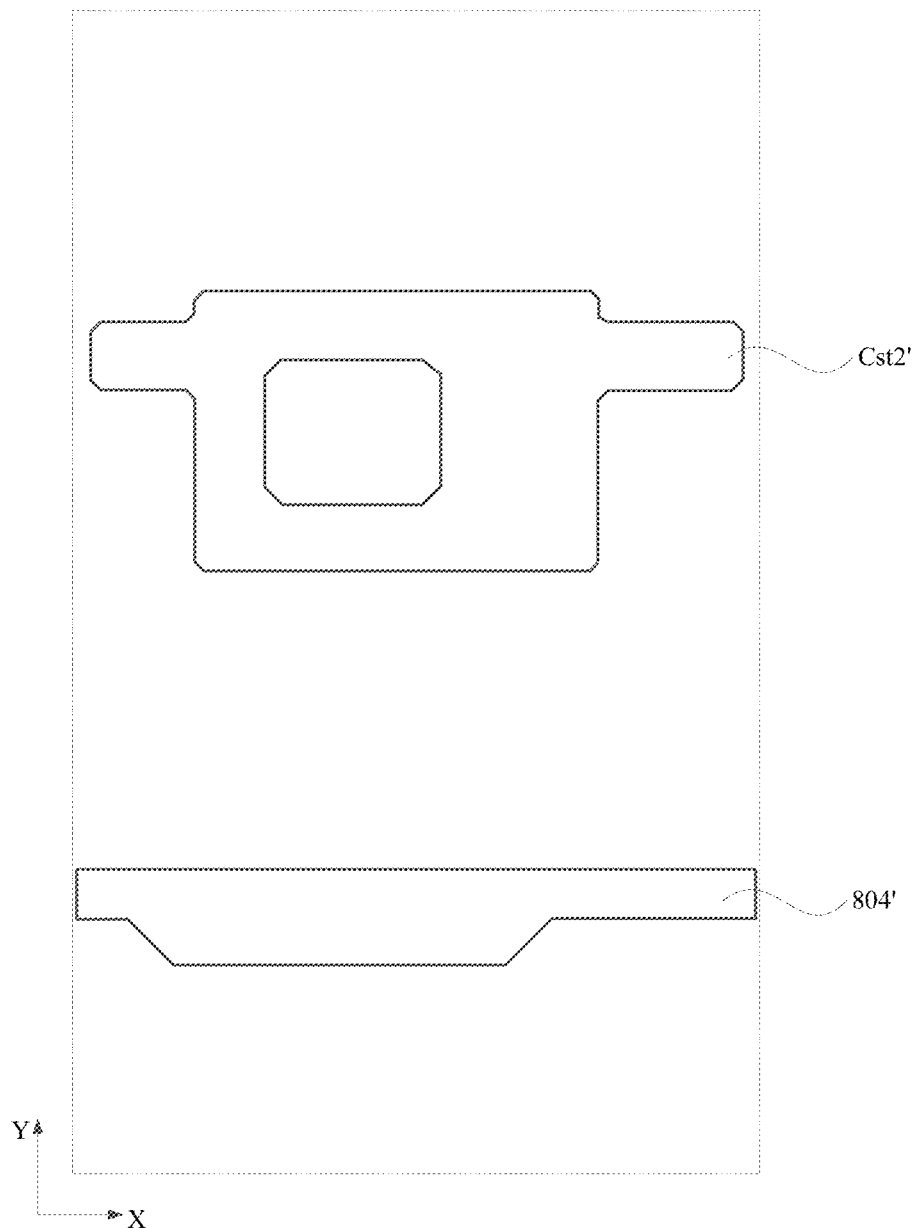
FIG. 10 is a schematic view showing layout of a second gate metal layer in FIG. 7.

As shown in FIG. 10, the second gate metal layer may be used to form the second electrode plate Cst2' of the first storage capacitor Cst' and the first initialization signal line pattern 804 of the display substrate.

Figure 11:
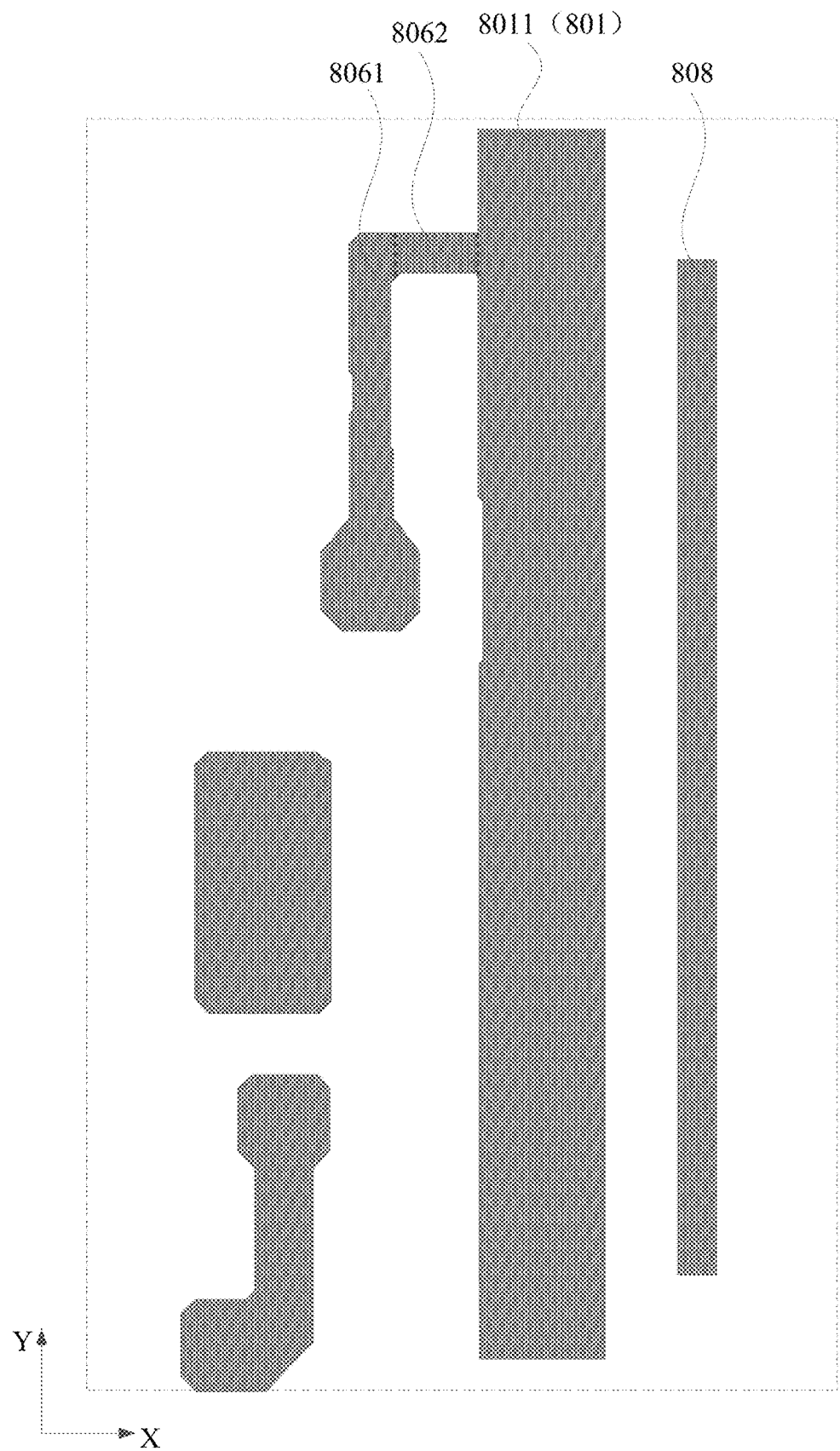
FIG. 11 is a schematic view showing layout of a source-drain metal layer in FIG. 7.

As shown in FIGS. 6, 7 and 11, the first source-drain metal layer may be used to form the source electrodes (e.g., S2' to S7') and the drain electrodes (e.g., D2' to D7') of the transistors in the virtual subpixel driving circuit, as well as the first data line pattern 808, the first power source signal line pattern 801, the first conductive connection member 8061 and the second conductive connection member 8062 of the display substrate.

More specifically, referring to FIGS. 6 to 9 again, the gate electrode 202*g*' of the second virtual transistor T2' may cover a second channel region 102*pg*', the source electrode S2' of the second virtual transistor T2' may be located at a second source electrode formation region 102*ps*', and the drain electrode D2' of the second virtual transistor T2' may be located at a second drain electrode formation region 102*pd*'.

The gate electrode 203*g*' of the third virtual transistor T3' may cover a third channel region 103*pg*', the source electrode S3' of the third virtual transistor T3' may be located at a third source electrode formation region 103*ps*', and the drain electrode D3' of the third virtual transistor T3' may be located at a third drain electrode formation region 103*pd*'.

The gate electrode 205*g*' of the fifth virtual transistor T5' may cover a fifth channel region 105*pg*', the source electrode S5' of the fifth virtual transistor T5' may be located at a fifth source electrode formation region 105*ps*', and the drain electrode D5' of the fifth virtual transistor T5' may be located at a fifth drain electrode formation region 105*pd*'.

The gate electrode 206*g*' of the sixth virtual transistor T6' may cover a sixth channel region 106*pg*', the source electrode S6' of the sixth virtual transistor T6' may be located at a sixth source electrode formation region 106*ps*', and the drain electrode D6' of the sixth virtual transistor T6' may be located at a sixth drain electrode formation region 106*pd*'.

The gate electrode 207*g*' of the seventh virtual transistor T7' may cover a seventh channel region 106*pg*', the source electrode S7' of the seventh virtual transistor T7' may be located at a seventh source electrode formation region 107*ps*', and the drain electrode D7' of the seventh virtual transistor T7' may be located at a seventh drain electrode formation region 107*pd*'.

The gate electrode 203*g*' of the third virtual transistor T3' may be reused as the first electrode plate Cst1 ' of the first storage capacitor Cst', and the second electrode plate Cst2' of the storage capacitor Cst' may be coupled to the first power source signal line pattern 801.

In addition, in the display substrate according to the embodiments of the present disclosure, the plurality of display subpixels 90 may be arranged in an array form, i.e., in a plurality of rows and columns. Each row of display subpixels 90 may include a plurality of display subpixels 90 arranged in the second direction, and each column of display subpixels 90 may include a plurality of display subpixels 90 arranged in the first direction intersecting the second direction.

In order to simplify the layout space for the subpixels, the gate electrode 207*g*' of the seventh virtual transistor T7' of each virtual subpixel 80 in one row may be coupled to the second resetting signal line pattern 9051 in a next adjacent display subpixel 90 in the first direction.

As shown in FIG. 7, in some embodiments of the present disclosure, taking the subpixel driving circuit in one virtual subpixel 80 as an example, in the first direction (e.g., the direction Y), the gate electrode 202*g*' of the second virtual transistor T2' may be located at a first side of the gate electrode of the virtual driving transistor (i.e., the gate electrode 203g' of the third virtual transistor T3'), and the gate electrode 207g' of the seventh virtual transistor T7', the gate electrode 206g' of the sixth virtual transistor T6' and the gate electrode 205g' of the fifth virtual transistor T5' may be located at a second side of the gate electrode of the virtual driving transistor. For example, the first side and the second side of the gate electrode of the virtual driving transistor may be two opposite sides in the first direction. Further, the first side of the gate electrode of the virtual driving transistor may be an upper side of the gate electrode of the virtual driving transistor, and the second side of the gate electrode of the virtual driving transistor may be a lower side of the gate electrode of the virtual driving transistor T3'. For example, a side of a virtual substrate for bonding an IC may be the lower side of the virtual substrate, and a side of the gate electrode of the virtual driving transistor closer to the IC may be the lower side. The upper side may be a side opposite to the lower side, e.g., a side of the gate electrode of the virtual driving transistor further away from the IC.

In some embodiments of the present disclosure, as shown in FIG. 7, in the second direction (e.g., the direction X), the gate electrode 205g' of the fifth virtual transistor T5' may be located at a third side of the gate electrode of the virtual driving transistor, and the gate electrode 206g' of the sixth virtual transistor T6' may be located at a fourth side of the gate electrode of the virtual driving transistor. For example, the third side and the fourth side of the gate electrode of the virtual driving transistor may be two opposite sides in the second direction. Further, the third side of the gate electrode of the virtual driving transistor may be a right side of the gate electrode of the virtual driving transistor, and the fourth side of the gate electrode of the virtual driving transistor may be a left side of the gate electrode of the virtual driving transistor. For example, in a same subpixel, the first data line pattern 808 may be located at the right side of the first power source signal line pattern 801, and the first power source signal line pattern 801 may be located at a right side of the second data line pattern 808.

The present disclosure further provides in some embodiments a display device including the above-mentioned display substrate.

In the above-mentioned display substrate 1, the second conductive connection member 8062 may be provided to couple the first conductive connection member 8061 to the first potential signal line pattern 801, so as to maintain the node N1 in the virtual subpixel driving circuit at a same stable potential as the first potential signal line pattern 801 all the time, thereby to prevent the occurrence of such a phenomenon as display brightness non-uniformity at a local area of the display substrate 1 due to a floating state of the node N1. When the display device in the embodiments of the present disclosure includes the above-mentioned display substrate, a same beneficial effect may be achieved and thus will not be particularly defined herein.

It should be appreciated that, the display device may be any product or member having a display function, e.g., television, display, digital photo frame, mobile phone or tablet computer.

The present disclosure further provides in some embodiments a method for manufacturing a display substrate, which includes forming a plurality of subpixels in an array form on a base substrate. The plurality of subpixels includes a plurality of display subpixels 90 at a display region of the display substrate and a plurality of virtual subpixels 80, and at least a part of the virtual subpixels are arranged adjacent to the display subpixels. Each display subpixel 90 includes a display subpixel driving circuit, and the display subpixel driving circuit includes a driving transistor (i.e., a third transistor T3), a first transistor T1 and a second transistor T2. A gate electrode of the driving transistor is coupled to a second electrode (i.e., a drain electrode D1) of the first transistor T1 and a second electrode (i.e., a drain electrode D2) of the second transistor T2. Each virtual subpixel 80 includes a first potential signal line pattern, a virtual subpixel driving circuit including a virtual driving transistor and a first conductive connection member 8061 coupled to a gate electrode of the virtual driving transistor, and a second conductive connection member 8062 coupled to the first conductive connection member 8061 and the first potential signal line pattern.

In the display substrate 1 manufactured using the above-mentioned method, the second conductive connection member 8062 may couple the first conductive connection member 8061 to the first potential signal line pattern, so as to maintain the node N1 in the virtual subpixel driving circuit at a same stable potential as the first potential signal line pattern all the time, thereby to prevent the occurrence of such a phenomenon as display brightness non-uniformity at a local area of the display substrate 1 due to a floating state of the node N1.

In some embodiments of the present disclosure, the first potential signal line pattern may include a first power source signal line pattern 801, and the forming the first conductive connection member 8061, the second conductive connection member 8062 and the first potential signal line pattern may include forming first conductive connection member 8061, the second conductive connection member 8062 and the first potential signal line pattern integrally through a single patterning process.

When the first conductive connection member 8061, the second conductive connection member 8062 and the first potential signal line pattern are formed simultaneously through a single patterning process, it is able to simplify a manufacture process of the display substrate in a better manner, thereby to reduce the manufacture cost of the display substrate.

It should be appreciated that, in the drawings, each small box with crossing lines represents an approximate position of the via-hole.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate and a plurality of subpixels arranged on the base substrate in an array form, wherein the plurality of subpixels comprises a plurality of display subpixels at a display region of the display substrate and a plurality of virtual subpixels, and at least a part of the virtual subpixels are arranged adjacent to the display subpixels;
the display subpixel comprises a display subpixel driving circuit, the display subpixel driving circuit comprises a driving transistor, a first transistor and a second transistor, and a gate electrode of the driving transistor is coupled to a second electrode of the first transistor and a second electrode of the second transistor; and
the virtual subpixel comprises a first potential signal line pattern, a virtual subpixel driving circuit comprising a virtual driving transistor and a first conductive connection member coupled to a gate electrode of the virtual driving transistor, and a second conductive connection member coupled to the first conductive connection member and the first potential signal line pattern.

2. The display substrate according to claim 1, wherein
the first conductive connection member extends in a first direction,
the first potential signal line pattern comprises a first power source signal line pattern comprising a first portion extending in the first direction,
the second conductive connection member extends in a second direction intersecting the first direction, and the second conductive connection member is coupled to the first conductive connection member and the first portion of the first power source signal line pattern.

3. The display substrate according to claim 1, wherein
the first potential signal line pattern comprises a first power source signal line pattern comprising a first portion and a second portion coupled to each other, the first portion extends in a first direction, the second portion extends in a second direction intersecting the first direction,
the first conductive connection member extends in the first direction, and
the second conductive connection member extends in the first direction and is coupled to the first conductive connection member and the second portion of the first power source signal line pattern.

4. The display substrate according to claim 3, wherein the second portions in at least two virtual subpixels are coupled to each other in the second direction.

5. The display substrate according to claim 3, wherein
the first portion and the second portion in at least one target virtual subpixel are formed integrally, and
the target virtual subpixel is an outermost virtual subpixel arranged at the display region in the first direction.

6. The display substrate according to claim 1, wherein
the first potential signal line pattern comprises a first power source signal line pattern, and
the first conductive connection member, the second conductive connection member and the first power source signal line pattern are formed integrally.

7. The display substrate according to claim 1, wherein the virtual subpixel further comprises;
a first gate line pattern and a first light-emission control signal line pattern each extending in the second direction, the first gate line pattern and the first light-emission control signal line pattern are arranged in the first direction, an orthogonal projection of the gate electrode of the virtual driving transistor onto the base substrate is located between an orthogonal projection of the first gate line pattern onto the base substrate and an orthogonal projection of the first light-emission control signal line pattern onto the base substrate, and
the orthogonal projection of the first gate line pattern onto the base substrate is located between an orthogonal projection of the second conductive connection member onto the base substrate and the orthogonal projection of the first light-emission control signal line pattern onto the base substrate.

8. The display substrate according to claim 7, wherein the display subpixel comprises:
a second gate line pattern and a second light-emission control signal line pattern each extending in the second direction,
wherein the first gate line pattern in at least one virtual subpixel in the second direction is formed integrally with the second gate line pattern in a display subpixel arranged adjacent to the at least one virtual subpixel and arranged in a same row as the virtual subpixel in the second direction, and
the first light-emission control signal line pattern in at least one virtual subpixel in the second direction is formed integrally with the second light-emission control signal line pattern in a display subpixel arranged adjacent to the at least one virtual subpixel and arranged in a same row as the virtual subpixel in the second direction.

9. The display substrate according to claim 1, wherein the first potential signal line pattern comprises a first power source signal line pattern, the virtual subpixel driving circuit further comprises:
a first storage capacitor, wherein the gate electrode of the virtual driving transistor is reused as a first electrode plate of the first storage capacitor, a second electrode plate of the first storage capacitor is located at a side of the first electrode plate away from the base substrate, an orthogonal projection of the second electrode plate onto the base substrate overlaps an orthogonal projection of a first portion of the first power source signal line pattern extending in the first direction onto the base substrate at an overlapping region where the second electrode plate is coupled to the first portion,
the display subpixel further comprises:
a second power source signal line pattern comprising a third portion extending in the first direction,
wherein the display subpixel driving circuit further comprises a second storage capacitor, the gate electrode of the driving transistor is reused as a third electrode plate of the second storage capacitor, a fourth electrode plate of the second storage capacitor is located at a side of the third electrode plate away from the base substrate, and an orthogonal projection of the fourth electrode plate onto the base substrate overlaps an orthogonal projection of the third portion of the second power source signal line pattern onto the base substrate at an overlapping region where the fourth electrode plate is coupled to the third portion, and the second electrode plate in each of the virtual subpixels arranged in a same row in the second direction is formed integrally with the fourth electrode plate in the corresponding display subpixel in the row.

10. The display substrate according to claim 1, wherein the display subpixel comprises:

a second power source signal line pattern comprising a third portion extending in the first direction, and the first portion of the first power source signal line pattern in each of the virtual subpixels in a same column in the first direction is formed integrally with the third portion of the second power source signal line pattern in the corresponding display subpixel in the column.

11. The display substrate according to claim 1, wherein the virtual subpixel further comprises a first data line pattern extending in the first direction, the display subpixel comprises a second data line pattern extending in the first direction, and the first data line pattern in each of the virtual subpixels in a same column in the first direction is formed integrally with the second data line pattern in the corresponding display subpixel in the column.

12. The display substrate according to claim 1, wherein the virtual subpixel comprises an active layer pattern, the active layer pattern comprises:

a first active sub-pattern and a second active sub-pattern arranged opposite to each other and each extending in the first direction; and a third active sub-pattern arranged between the first active sub-pattern and the second active sub-pattern, wherein two ends of the third active sub-pattern are coupled to the first active sub-pattern and the second active sub-pattern respectively, an orthogonal projection of at least a part of the third active sub-pattern onto the base substrate overlaps the orthogonal projection of the gate electrode of the virtual driving transistor onto the base substrate, and an orthogonal projection of a portion of the first conductive connection member away from the gate electrode of the virtual driving transistor onto the base substrate does not overlap an orthogonal projection of the active layer pattern onto the base substrate.

13. The display substrate according to claim 12, wherein the virtual subpixel further comprises a first data line pattern extending in the first direction, an orthogonal projection of the second active sub-pattern onto the base substrate is located between an orthogonal projection of the first data line pattern onto the base substrate and an orthogonal projection of the first active sub-pattern onto the base substrate, and the orthogonal projection of the first data line pattern onto the base substrate does not overlap the orthogonal projection of the active layer pattern onto the base substrate.

14. The display substrate according to claim 1, wherein the first potential signal line pattern comprises a first power source signal line pattern, the virtual subpixel further comprises:

a first data line pattern, a first gate line pattern, a first light-emission control signal line pattern, a first resetting signal line pattern and a first initialization signal line pattern, wherein at least a part of the first power source signal line pattern and the first data line pattern extend in the first direction, and the first gate line pattern, the first light-emission control signal line pattern, the first resetting signal line pattern and the first initialization signal line pattern extend in the second direction, wherein the virtual subpixel driving circuit further comprises a second virtual transistor, a fifth virtual transistor and a sixth virtual transistor, the gate electrode of the virtual driving transistor is coupled to the first power source signal line pattern, a first electrode of the virtual driving transistor is coupled to a second electrode of the fifth virtual driving transistor, and a second electrode of the virtual driving transistor is coupled to a first electrode of the sixth virtual transistor, a gate electrode of the second virtual transistor is coupled to the first resetting signal line pattern, a first electrode of the second virtual transistor is coupled to the first initialization signal line pattern, a second electrode of the second virtual transistor is in a floating state, a gate electrode of the fifth virtual transistor is coupled to the first light-emission control signal line pattern, a first electrode of the fifth virtual transistor is coupled to the first power source signal line pattern, and a gate electrode of the sixth virtual transistor is coupled to the first light-emission control signal line pattern.

15. The display substrate according to claim 1, wherein the display subpixel driving circuit further comprises a third conductive connection member extending in the first direction, a first end of the third conductive connection member is coupled to the gate electrode of the driving transistor, and a second end of the third conductive connection member is coupled to the second electrode of the first transistor and the second electrode of the second transistor.

16. The display substrate according to claim 15, wherein the second electrode of the first transistor is coupled to the second electrode of the second transistor to form a common connection end, and an orthogonal projection of the second end of the third conductive connection member onto the base substrate overlaps an orthogonal projection of the common connection end onto the base substrate at an overlapping region where the second end of the third conductive connection member is coupled to the common connection end.

17. The display substrate according to claim 1, wherein the display subpixel comprises a second power source signal line pattern, a second data line pattern, a second gate line pattern, a second light-emission control signal line pattern, a second resetting signal line pattern, a third resetting signal line pattern, a second initialization signal line pattern and a third initialization signal line pattern, wherein at least a part of the second power source signal line pattern and the second data line pattern extend in a first direction, and the second gate line pattern, the second light-emission control signal line pattern, the second resetting signal line pattern, the third resetting signal line pattern, the second initialization signal line pattern and the third initialization signal line pattern extend in a second direction intersecting the first direction, wherein the display subpixel driving circuit further comprises a fourth transistor, a fifth transistor, a sixth transistor and a seventh transistor;

a first electrode of the driving transistor is coupled to a second electrode of the fifth transistor, a second electrode of the driving transistor is coupled to a first electrode of the first transistor;

a gate electrode of the first transistor is coupled to the second gate line pattern;

a gate electrode of the second transistor is coupled to the second resetting signal line pattern, and a first electrode of the second transistor is coupled to the second initialization signal line pattern;

a gate electrode of the fourth transistor is coupled to the second gate line pattern, a first electrode of the fourth transistor is coupled to the second data line pattern, and a second electrode of the fourth transistor is coupled to the first electrode of the driving transistor;

a gate electrode of the fifth transistor is coupled to the second light-emission control signal line pattern, and a first electrode of the fifth transistor is coupled to the second power source signal line pattern;

a gate electrode of the sixth transistor is coupled to the second light-emission control signal line pattern, a first electrode of the sixth transistor is coupled to the second electrode of the driving transistor, and a second electrode of the sixth transistor is coupled to a light-emitting element in the display subpixel; and a second electrode of the seventh transistor is coupled to the light-emitting element in the display subpixel, a gate electrode of the seventh transistor is coupled to the third resetting signal line pattern, and a first electrode of the seventh transistor is coupled to the third initialization signal line pattern.

18. The display substrate according to claim 1, wherein the first conductive connection member and the second conductive connection member are formed integrally.

19. A display device, comprising the display substrate according to claim 1.

20. A method for manufacturing a display substrate, comprising:

forming a plurality of subpixels in an array form on a base substrate, wherein the plurality of subpixels comprises a plurality of display subpixels at a display region of the display substrate and a plurality of virtual subpixels, and at least a part of the virtual subpixels are arranged adjacent to the display subpixels, wherein the display subpixel comprises a display subpixel driving circuit, the display subpixel driving circuit comprises a driving transistor, a first transistor and a second transistor, and a gate electrode of the driving transistor is coupled to a second electrode of the first transistor and a second electrode of the second transistor, wherein the virtual subpixel comprises a first potential signal line pattern, a virtual subpixel driving circuit comprising a virtual driving transistor and a first conductive connection member coupled to a gate electrode of the virtual driving transistor, and a second conductive connection member coupled to the first conductive connection member and the first potential signal line pattern.

* * * * *